US008021005B2

(12) United States Patent
Zhao

(10) Patent No.: US 8,021,005 B2
(45) Date of Patent: Sep. 20, 2011

(54) EXTERIOR MIRROR ELEMENT WITH WIDE ANGLE PORTION

(75) Inventor: Mingtang Zhao, Grand Rapids, MI (US)

(73) Assignee: Donnelly Corporation, Holland, MI (US)

( * ) Notice: Subject to any disclaimer, the term of this patent is extended or adjusted under 35 U.S.C. 154(b) by 0 days.

(21) Appl. No.: 13/097,570

(22) Filed: Apr. 29, 2011

(65) Prior Publication Data

US 2011/0205614 A1    Aug. 25, 2011

Related U.S. Application Data

(63) Continuation of application No. 12/971,228, filed on Dec. 17, 2010, now Pat. No. 7,934,844, which is a continuation of application No. 12/893,242, filed on Sep. 29, 2010, now Pat. No. 7,887,204, which is a continuation of application No. 12/776,780, filed on May 10, 2010, now Pat. No. 7,824,045, which is a continuation of application No. 12/124,297, filed on May 21, 2008, now Pat. No. 7,748,856.

(60) Provisional application No. 60/939,753, filed on May 23, 2007.

(51) Int. Cl.
*G02B 5/10* (2006.01)

(52) U.S. Cl. ........................................ 359/868

(58) Field of Classification Search ................ 359/841, 359/866, 868, 869, 871, 872
See application file for complete search history.

(56) References Cited

U.S. PATENT DOCUMENTS

| | | | |
|---|---|---|---|
| 1,114,559 A | 10/1914 | Weed | |
| 1,672,559 A | 6/1928 | Doble | |
| RE17,274 E | 4/1929 | Porter | |
| 2,135,262 A | 11/1938 | Schumacher | |
| 2,263,382 A | 11/1941 | Gotzinger | |
| 2,514,989 A | 7/1950 | Buren | |
| 2,580,014 A | 12/1951 | Gazda | |
| 2,636,419 A | 4/1953 | Kerr | |
| 2,778,273 A | 1/1957 | Fellmeth | |
| 2,911,177 A | 11/1959 | West | |
| 3,104,274 A | 9/1963 | King | |
| 3,131,250 A | 4/1964 | Ely | |
| 3,146,296 A | 8/1964 | Fischer | |
| 3,170,985 A | 2/1965 | Katulich | |
| 3,175,463 A | 3/1965 | Seashore | |

(Continued)

FOREIGN PATENT DOCUMENTS

CN    3336405    9/2003

(Continued)

*Primary Examiner* — Euncha P Cherry
(74) *Attorney, Agent, or Firm* — Gardner, Linn, Burkhart & Flory, LLP

(57) ABSTRACT

An electrochromic mirror reflective element suitable for use in an exterior rearview mirror assembly of a vehicle includes front and rear glass substrates and an electrochromic medium disposed therebetween. The electrochromic mirror reflective element includes a principal planar reflector portion and an auxiliary wide angle curved portion. The curved recess may have a cross-dimension size that is in the range from about 30 millimeters to about 80 millimeters, and has a radius of curvature that is in the range from about 200 millimeters to about 1,000 millimeters, and has a maximum recess depth that is in the range from about 0.11 millimeters to about 4.04 millimeters. The electrochromic medium is disposed between the second surface of the front glass substrate and the third surface of the rear glass substrate and may be in contact with the principal planar reflector portion and the auxiliary wide angle curved portion.

201 Claims, 6 Drawing Sheets

U.S. PATENT DOCUMENTS

| | | |
|---|---|---|
| 3,266,016 A | 8/1966 | Maruyama et al. |
| 3,267,806 A | 8/1966 | Azegami |
| 3,280,701 A | 10/1966 | Donnelly et al. |
| 3,337,285 A | 8/1967 | Travis |
| 3,338,655 A | 8/1967 | Young |
| 3,375,053 A | 3/1968 | Ward |
| 3,389,952 A | 6/1968 | Tobin, Jr. |
| 3,404,935 A | 10/1968 | Creager |
| 3,408,136 A | 10/1968 | Travis |
| 3,424,517 A | 1/1969 | Budreck |
| 3,563,638 A | 2/1971 | Panozzo |
| 3,601,614 A | 8/1971 | Platzer, Jr. |
| 3,610,739 A | 10/1971 | Seashore |
| 3,667,833 A | 6/1972 | Baldwin, Sr. |
| 3,708,222 A | 1/1973 | Stern |
| 3,764,201 A | 10/1973 | Haile |
| 3,806,232 A | 4/1974 | Gray |
| 3,826,563 A | 7/1974 | Davis |
| 3,881,811 A | 5/1975 | French |
| 3,909,117 A | 9/1975 | Takahashi et al. |
| 4,200,359 A | 4/1980 | Lawson |
| 4,223,983 A | 9/1980 | Bloom |
| 4,258,979 A | 3/1981 | Mahin |
| 4,264,144 A | 4/1981 | McCord |
| 4,268,120 A | 5/1981 | Jitsumori |
| 4,281,899 A | 8/1981 | Oskam |
| 4,293,191 A | 10/1981 | Kim |
| 4,303,308 A | 12/1981 | Kobrin |
| 4,306,770 A | 12/1981 | Marhauer |
| 4,311,362 A | 1/1982 | LaPorte |
| 4,311,363 A | 1/1982 | Marsalka et al. |
| 4,325,609 A | 4/1982 | Alford |
| 4,331,382 A | 5/1982 | Graff |
| 4,350,412 A | 9/1982 | Steenblik et al. |
| 4,435,042 A | 3/1984 | Wood et al. |
| 4,436,371 A | 3/1984 | Wood et al. |
| 4,436,372 A | 3/1984 | Schmidt et al. |
| 4,439,013 A | 3/1984 | Hagn et al. |
| 4,449,786 A | 5/1984 | McCord |
| 4,470,665 A | 9/1984 | Blom |
| 4,499,451 A | 2/1985 | Suzuki et al. |
| 4,526,446 A | 7/1985 | Adams |
| 4,549,786 A | 10/1985 | Albers et al. |
| 4,555,166 A | 11/1985 | Enomoto |
| 4,575,202 A | 3/1986 | McGuire |
| 4,588,267 A | 5/1986 | Pastore |
| 4,609,266 A | 9/1986 | Blom |
| 4,623,222 A | 11/1986 | Itoh et al. |
| 4,629,296 A | 12/1986 | White |
| 4,630,904 A | 12/1986 | Pastore |
| 4,674,849 A | 6/1987 | Stewart |
| 4,674,850 A | 6/1987 | Blom |
| 4,678,294 A | 7/1987 | Van Nostrand |
| 4,679,906 A | 7/1987 | Brandenburg |
| 4,712,879 A | 12/1987 | Lynam et al. |
| 4,715,701 A | 12/1987 | Urban |
| 4,721,364 A | 1/1988 | Itoh et al. |
| 4,727,302 A | 2/1988 | Mizuta et al. |
| 4,733,336 A | 3/1988 | Skogler et al. |
| 4,770,522 A | 9/1988 | Alten |
| 4,773,740 A | 9/1988 | Kawakami et al. |
| D297,926 S | 10/1988 | Kesler |
| 4,793,690 A | 12/1988 | Gahan et al. |
| 4,799,768 A | 1/1989 | Gahan |
| 4,824,231 A | 4/1989 | Quintana |
| 4,826,289 A | 5/1989 | Vandenbrink et al. |
| 4,828,379 A | 5/1989 | Parsons et al. |
| 4,853,283 A | 8/1989 | Skolnick |
| 4,859,046 A | 8/1989 | Traynor et al. |
| 4,882,466 A | 11/1989 | Friel |
| 4,882,565 A | 11/1989 | Gallmeyer |
| 4,906,075 A | 3/1990 | Majsumiya |
| 4,906,085 A | 3/1990 | Sugihara et al. |
| 4,913,542 A | 4/1990 | Adolfsson |
| 4,917,485 A | 4/1990 | Baldwin, Sr. |
| 4,929,074 A | 5/1990 | Urban |
| 4,932,769 A | 6/1990 | Goosen |
| 4,932,770 A | 6/1990 | Caravaty |
| 4,948,242 A | 8/1990 | Desmond et al. |
| 4,989,964 A | 2/1991 | Meise |
| 5,005,962 A | 4/1991 | Edelman |
| 5,014,167 A | 5/1991 | Roberts |
| 5,022,747 A | 6/1991 | Polanyi et al. |
| 5,033,835 A | 7/1991 | Platzer, Jr. |
| 5,044,739 A | 9/1991 | do Espirito Santo |
| 5,050,977 A | 9/1991 | Platzer, Jr. |
| 5,052,792 A | 10/1991 | McDonough |
| 5,066,112 A | 11/1991 | Lynam et al. |
| 5,073,012 A | 12/1991 | Lynam |
| 5,076,673 A | 12/1991 | Lynam et al. |
| 5,078,480 A | 1/1992 | Warszawski |
| 5,080,492 A | 1/1992 | Platzer, Jr. |
| 5,107,374 A | 4/1992 | Lupo et al. |
| 5,115,346 A | 5/1992 | Lynam |
| 5,115,352 A | 5/1992 | do Espirito Santo |
| 5,117,346 A | 5/1992 | Gard |
| 5,118,540 A | 6/1992 | Hutchison |
| 5,140,455 A | 8/1992 | Varaprasad et al. |
| 5,142,407 A | 8/1992 | Varaprasad et al. |
| 5,151,816 A | 9/1992 | Varaprasad et al. |
| 5,151,824 A | 9/1992 | O'Farrell |
| 5,166,833 A | 11/1992 | Shyu |
| 5,178,448 A | 1/1993 | Adams et al. |
| 5,179,471 A | 1/1993 | Caskey et al. |
| 5,183,099 A | 2/1993 | Bechu |
| 5,189,537 A | 2/1993 | O'Farrell |
| 5,193,029 A | 3/1993 | Schofield et al. |
| 5,207,492 A | 5/1993 | Roberts |
| 5,225,943 A | 7/1993 | Lupo |
| 5,233,461 A | 8/1993 | Dornan et al. |
| 5,237,458 A | 8/1993 | Polanyi et al. |
| 5,237,459 A | 8/1993 | Strauss |
| 5,239,405 A | 8/1993 | Varaprasad et al. |
| 5,247,395 A | 9/1993 | Martinez |
| 5,253,109 A | 10/1993 | O'Farrell et al. |
| 5,285,060 A | 2/1994 | Larson et al. |
| 5,295,021 A | 3/1994 | Swanson |
| 5,296,973 A | 3/1994 | Burke |
| 5,313,335 A | 5/1994 | Gray et al. |
| 5,327,288 A | 7/1994 | Wellington et al. |
| 5,354,965 A | 10/1994 | Lee |
| 5,355,245 A | 10/1994 | Lynam |
| 5,371,659 A | 12/1994 | Pastrick et al. |
| 5,406,414 A | 4/1995 | O'Farrell et al. |
| 5,412,512 A | 5/1995 | Zebold et al. |
| 5,424,875 A | 6/1995 | Davis, II |
| 5,432,643 A | 7/1995 | Huang |
| 5,437,931 A | 8/1995 | Tsai et al. |
| 5,446,576 A | 8/1995 | Lynam et al. |
| 5,448,397 A | 9/1995 | Tonar |
| 5,481,409 A | 1/1996 | Roberts |
| 5,497,305 A | 3/1996 | Pastrick et al. |
| 5,497,306 A | 3/1996 | Pastrick |
| 5,509,606 A | 4/1996 | Breithaupt et al. |
| 5,517,367 A | 5/1996 | Kim et al. |
| 5,523,877 A | 6/1996 | Lynam |
| 5,525,264 A | 6/1996 | Cronin et al. |
| 5,526,195 A | 6/1996 | Thomas |
| 5,530,588 A | 6/1996 | Vivier |
| 5,535,056 A | 7/1996 | Caskey et al. |
| 5,550,677 A | 8/1996 | Schofield et al. |
| 5,557,467 A | 9/1996 | McColgan et al. |
| 5,559,640 A | 9/1996 | Vachss et al. |
| 5,563,744 A | 10/1996 | Matsumiya |
| 5,567,360 A | 10/1996 | Varaprasad et al. |
| 5,575,552 A | 11/1996 | Faloon et al. |
| 5,579,133 A | 11/1996 | Black et al. |
| 5,587,236 A | 12/1996 | Agrawal et al. |
| 5,587,699 A | 12/1996 | Faloon et al. |
| 5,594,222 A | 1/1997 | Caldwell |
| 5,594,593 A | 1/1997 | Milner |
| 5,610,756 A | 3/1997 | Lynam et al. |
| 5,621,569 A | 4/1997 | Schlenke |
| 5,621,577 A | 4/1997 | Lang et al. |
| 5,644,442 A | 7/1997 | Lemere |
| 5,649,756 A | 7/1997 | Adams et al. |
| 5,668,663 A | 9/1997 | Varaprasad et al. |

| | | | | | | |
|---|---|---|---|---|---|---|
| 5,669,698 | A | 9/1997 | Veldman et al. | 6,315,419 | B1 | 11/2001 | Platzer, Jr. |
| 5,669,699 | A | 9/1997 | Pastrick et al. | 6,318,870 | B1 | 11/2001 | Spooner et al. |
| 5,669,704 | A | 9/1997 | Pastrick | 6,320,282 | B1 | 11/2001 | Caldwell |
| 5,669,705 | A | 9/1997 | Pastrick et al. | 6,329,925 | B1 | 12/2001 | Skiver et al. |
| 5,670,935 | A | 9/1997 | Schofield et al. | 6,335,548 | B1 | 1/2002 | Roberts et al. |
| 5,689,370 | A | 11/1997 | Tonar et al. | 6,341,523 | B2 | 1/2002 | Lynam |
| 5,691,855 | A | 11/1997 | Lupkas | 6,343,402 | B1 | 2/2002 | Smith et al. |
| 5,715,093 | A | 2/1998 | Schierbeek et al. | 6,356,376 | B1 | 3/2002 | Tonar et al. |
| 5,722,836 | A | 3/1998 | Younker | 6,359,274 | B1 | 3/2002 | Nixon et al. |
| 5,724,187 | A | 3/1998 | Varaprasad et al. | 6,379,013 | B1 | 4/2002 | Bechtel et al. |
| 5,751,489 | A | 5/1998 | Caskey et al. | 6,390,632 | B1 | 5/2002 | Palathingal |
| 5,760,962 | A | 6/1998 | Schofield et al. | 6,396,397 | B1 | 5/2002 | Bos et al. |
| 5,784,211 | A | 7/1998 | Mingledorff | 6,398,377 | B1 | 6/2002 | Chou |
| 5,786,772 | A | 7/1998 | Schofield et al. | 6,402,328 | B1 | 6/2002 | Bechtel et al. |
| 5,788,357 | A | 8/1998 | Muth et al. | 6,420,036 | B1 | 7/2002 | Varaprasad et al. |
| 5,790,298 | A | 8/1998 | Tonar | 6,426,485 | B1 | 7/2002 | Bulgajewski et al. |
| 5,790,327 | A | 8/1998 | Lee et al. | 6,428,172 | B1 | 8/2002 | Hutzel et al. |
| 5,793,542 | A | 8/1998 | Kondo et al. | 6,441,943 | B1 | 8/2002 | Roberts et al. |
| 5,796,094 | A | 8/1998 | Schofield et al. | 6,441,964 | B1 | 8/2002 | Chu et al. |
| 5,796,532 | A | 8/1998 | Kanazawa | 6,445,287 | B1 | 9/2002 | Schofield et al. |
| 5,803,579 | A | 9/1998 | Turnbull et al. | 6,449,082 | B1 | 9/2002 | Agrawal et al. |
| 5,805,367 | A | 9/1998 | Kanazawa | 6,471,362 | B1 | 10/2002 | Carter et al. |
| 5,808,777 | A | 9/1998 | Lynam et al. | 6,472,979 | B2 | 10/2002 | Schofield et al. |
| 5,823,654 | A | 10/1998 | Pastrick et al. | 6,498,620 | B2 | 12/2002 | Schofield et al. |
| 5,825,527 | A | 10/1998 | Forgette et al. | 6,501,387 | B2 | 12/2002 | Skiver et al. |
| 5,835,294 | A | 11/1998 | Minegishi | 6,504,142 | B2 | 1/2003 | Nixon et al. |
| 5,838,505 | A | 11/1998 | Palathingal | 6,511,192 | B1 | 1/2003 | Henion et al. |
| 5,847,889 | A | 12/1998 | Komiyama et al. | 6,512,624 | B2 | 1/2003 | Tonar et al. |
| 5,863,116 | A | 1/1999 | Pastrick et al. | 6,521,916 | B2 | 2/2003 | Roberts et al. |
| 5,864,434 | A | 1/1999 | Taylor | 6,522,451 | B1 | 2/2003 | Lynam |
| 5,877,897 | A | 3/1999 | Schofield et al. | 6,523,976 | B1 | 2/2003 | Turnbull et al. |
| 5,910,854 | A | 6/1999 | Varaprasad et al. | 6,537,138 | B2 | 3/2003 | Ohmori et al. |
| 5,922,176 | A | 7/1999 | Caskey | 6,582,109 | B2 | 6/2003 | Miller |
| 5,923,457 | A | 7/1999 | Byker et al. | 6,595,649 | B2 | 7/2003 | Hoekstra et al. |
| 5,929,786 | A | 7/1999 | Schofield et al. | 6,615,438 | B1 | 9/2003 | Franco |
| 5,938,320 | A | 8/1999 | Crandall | 6,627,918 | B2 | 9/2003 | Getz et al. |
| 5,980,050 | A | 11/1999 | McCord | 6,642,851 | B2 | 11/2003 | Deline et al. |
| 6,001,486 | A | 12/1999 | Varaprasad et al. | 6,648,477 | B2 | 11/2003 | Hutzel et al. |
| 6,002,511 | A | 12/1999 | Varaprasad et al. | 6,669,109 | B2 | 12/2003 | Ivanov et al. |
| 6,002,544 | A | 12/1999 | Yatsu | 6,690,268 | B2 | 2/2004 | Schofield et al. |
| 6,005,724 | A | 12/1999 | Todd | 6,717,610 | B1 | 4/2004 | Bos et al. |
| 6,007,207 | A | 12/1999 | Liu | 6,717,712 | B2 | 4/2004 | Lynam et al. |
| 6,030,084 | A | 2/2000 | Schmidt | 6,719,215 | B2 | 4/2004 | Drouillard |
| 6,032,323 | A | 3/2000 | Smith et al. | 6,731,205 | B2 | 5/2004 | Schofield et al. |
| 6,033,078 | A | 3/2000 | Su et al. | 6,737,629 | B2 | 5/2004 | Nixon et al. |
| 6,065,840 | A | 5/2000 | Caskey et al. | 6,742,904 | B2 | 6/2004 | Bechtel et al. |
| 6,074,068 | A | 6/2000 | Palathingal | 6,757,109 | B2 | 6/2004 | Bos |
| 6,097,023 | A | 8/2000 | Schofield et al. | D493,131 | S | 7/2004 | Lawlor et al. |
| 6,102,546 | A | 8/2000 | Carter | D493,394 | S | 7/2004 | Lawlor et al. |
| 6,109,586 | A | 8/2000 | Hock | 6,824,281 | B2 | 11/2004 | Schofield et al. |
| 6,111,684 | A | 8/2000 | Forgette et al. | 6,831,268 | B2 | 12/2004 | Bechtel et al. |
| 6,116,743 | A | 9/2000 | Hoek | 6,882,287 | B2 | 4/2005 | Schofield |
| 6,124,647 | A | 9/2000 | Marcus et al. | 6,919,796 | B2 | 7/2005 | Boddy et al. |
| 6,132,072 | A | 10/2000 | Turnbull et al. | 6,932,483 | B2 | 8/2005 | Strumolo et al. |
| 6,154,306 | A | 11/2000 | Varaprasad et al. | 6,979,090 | B1 | 12/2005 | Wnuk |
| 6,164,564 | A | 12/2000 | Franco et al. | 7,005,974 | B2 | 2/2006 | McMahon et al. |
| 6,170,956 | B1 | 1/2001 | Rumsey et al. | 7,038,577 | B2 | 5/2006 | Pawlicki et al. |
| 6,172,613 | B1 | 1/2001 | DeLine et al. | 7,097,312 | B2 | 8/2006 | Platzer, Jr. |
| 6,176,602 | B1 | 1/2001 | Pastrick et al. | 7,106,392 | B2 | 9/2006 | You |
| 6,178,034 | B1 | 1/2001 | Allemand et al. | 7,126,456 | B2 | 10/2006 | Boddy et al. |
| 6,195,194 | B1 | 2/2001 | Roberts et al. | 7,167,294 | B2 * | 1/2007 | Lynam et al. ............ 359/868 |
| 6,196,688 | B1 | 3/2001 | Caskey et al. | 7,168,830 | B2 | 1/2007 | Pastrick et al. |
| 6,198,409 | B1 | 3/2001 | Schofield et al. | 7,184,190 | B2 | 2/2007 | McCabe et al. |
| 6,199,993 | B1 | 3/2001 | Mou | 7,195,381 | B2 | 3/2007 | Lynam et al. |
| 6,201,642 | B1 | 3/2001 | Bos | 7,249,860 | B2 | 7/2007 | Kulas et al. |
| 6,207,083 | B1 | 3/2001 | Varaprasad et al. | 7,255,451 | B2 | 8/2007 | McCabe et al. |
| 6,227,689 | B1 | 5/2001 | Miller | 7,267,448 | B2 | 9/2007 | Schmidt et al. |
| 6,229,435 | B1 | 5/2001 | Knapp et al. | 7,274,501 | B2 | 9/2007 | McCabe et al. |
| 6,239,898 | B1 | 5/2001 | Byker et al. | 7,289,037 | B2 | 10/2007 | Uken et al. |
| 6,244,716 | B1 | 6/2001 | Steenwyk et al. | 7,306,355 | B2 | 12/2007 | Walser et al. |
| 6,245,262 | B1 | 6/2001 | Varaprasad et al. | 7,324,261 | B2 | 1/2008 | Tonar et al. |
| 6,250,148 | B1 | 6/2001 | Lynam | 7,338,177 | B2 | 3/2008 | Lynam |
| 6,257,746 | B1 | 7/2001 | Todd et al. | 7,339,149 | B1 | 3/2008 | Schofield et al. |
| 6,260,608 | B1 | 7/2001 | Kim | 7,342,707 | B2 | 3/2008 | Roberts et al. |
| 6,270,225 | B1 | 8/2001 | Goolsby | 7,345,680 | B2 | 3/2008 | David |
| 6,276,821 | B1 | 8/2001 | Pastrick et al. | 7,349,143 | B2 | 3/2008 | Tonar et al. |
| 6,286,965 | B1 | 9/2001 | Caskey et al. | 7,370,983 | B2 | 5/2008 | DeWind et al. |
| 6,294,989 | B1 | 9/2001 | Schofield et al. | 7,377,675 | B2 | 5/2008 | Pastrick et al. |
| 6,310,611 | B1 | 10/2001 | Caldwell | 7,391,563 | B2 | 6/2008 | McCabe et al. |

| | | |
|---|---|---|
| 7,400,435 B2 | 7/2008 | Byers et al. |
| 7,420,756 B2 | 9/2008 | Lynam |
| 7,423,522 B2 | 9/2008 | O'Brien et al. |
| 7,492,281 B2 | 2/2009 | Lynam et al. |
| 7,526,103 B2 | 4/2009 | Schofield et al. |
| 7,581,859 B2 | 9/2009 | Lynam |
| 7,626,749 B2 | 12/2009 | Baur et al. |
| 7,636,188 B2 | 12/2009 | Baur et al. |
| 7,748,856 B2 | 7/2010 | Zhao |
| 7,824,045 B2 | 11/2010 | Zhao |
| 7,887,204 B2 | 2/2011 | Zhao |
| 7,934,844 B1 | 5/2011 | Zhao |
| 2002/0036828 A1 | 3/2002 | Wong |
| 2002/0105741 A1 | 8/2002 | Platzer, Jr. |
| 2002/0159169 A1 | 10/2002 | McCord |
| 2002/0159270 A1 | 10/2002 | Lynam et al. |
| 2003/0043589 A1 | 3/2003 | Blank |
| 2003/0117731 A1 | 6/2003 | Platzer, Jr. |
| 2004/0032638 A1 | 2/2004 | Tonar et al. |
| 2004/0032675 A1 | 2/2004 | Weller et al. |
| 2004/0032676 A1 | 2/2004 | Drummond et al. |
| 2004/0165291 A1 | 8/2004 | Platzer, Jr. |
| 2004/0264011 A1 | 12/2004 | Lynam |
| 2005/0078389 A1 | 4/2005 | Kulas et al. |
| 2005/0083577 A1 | 4/2005 | Varaprasad et al. |
| 2005/0099693 A1 | 5/2005 | Schofield et al. |
| 2005/0134983 A1 | 6/2005 | Lynam |
| 2005/0232469 A1 | 10/2005 | Schofield et al. |
| 2005/0248859 A1 | 11/2005 | Platzer, Jr. |
| 2006/0050018 A1 | 3/2006 | Hutzel et al. |
| 2006/0061008 A1 | 3/2006 | Karner et al. |
| 2006/0125919 A1 | 6/2006 | Camilleri et al. |
| 2006/0126150 A1 | 6/2006 | Tonar et al. |
| 2006/0171704 A1 | 8/2006 | Bingle et al. |
| 2006/0184297 A1 | 8/2006 | Higgins-Luthman |
| 2006/0268440 A1 | 11/2006 | Platzer, Jr. |
| 2007/0058257 A1 | 3/2007 | Lynam |
| 2007/0285789 A1 | 12/2007 | Lindahl et al. |
| 2008/0212189 A1 | 9/2008 | Baur et al. |
| 2008/0225421 A1 | 9/2008 | Platzer |
| 2008/0304170 A1 | 12/2008 | Zhao |
| 2009/0040306 A1 | 2/2009 | Foote et al. |
| 2009/0115631 A1 | 5/2009 | Foote et al. |
| 2009/0237820 A1 | 9/2009 | McCabe et al. |
| 2010/0039691 A1 | 2/2010 | Thomas et al. |
| 2010/0321757 A1 | 12/2010 | Cammenga et al. |

FOREIGN PATENT DOCUMENTS

| | | |
|---|---|---|
| CN | 3336407 | 9/2003 |
| DE | 2409748 | 9/1975 |
| DE | 2550095 | 5/1976 |
| DE | 2647592 | 4/1978 |
| DE | 2915521 | 10/1980 |
| DE | 3302735 | 8/1984 |
| DE | 3329998 | 3/1985 |
| DE | 3606020 | 8/1987 |
| DE | 3620228 | 12/1987 |
| DE | 3624321 | 2/1988 |
| DE | 3743072 | 7/1989 |
| DE | 4026578 | 4/1992 |
| EP | 0210757 | 2/1987 |
| EP | 0310261 | 4/1989 |
| EP | 0356099 | 2/1990 |
| EP | 0551802 | 1/1992 |
| EP | 0728618 | 8/1996 |
| EP | 0729864 | 9/1996 |
| EP | 0791503 | 8/1997 |
| EP | 0917987 | 5/1999 |
| FR | 2628042 | 3/1988 |
| GB | 1279158 | 6/1972 |
| GB | 2048189 | 12/1980 |
| GB | 2092534 | 8/1982 |
| JP | 55076721 | 10/1980 |
| JP | 362075619 | 4/1987 |
| JP | 62105103 | 5/1987 |
| JP | 1186443 | 7/1989 |
| JP | 1208245 | 8/1989 |
| JP | 491539 | 8/1992 |
| JP | 10086899 | 4/1998 |
| KR | 2002092059 | 12/2002 |
| NL | 7908257 | 6/1981 |
| WO | WO 0181956 | 11/2001 |
| WO | WO 2004026633 | 4/2004 |
| WO | WO 2004047421 | 6/2004 |
| WO | WO 2004103772 | 12/2004 |
| WO | WO 2006124682 | 11/2006 |
| WO | WO 2007005942 | 1/2007 |
| WO | WO 2008051910 | 5/2008 |

* cited by examiner

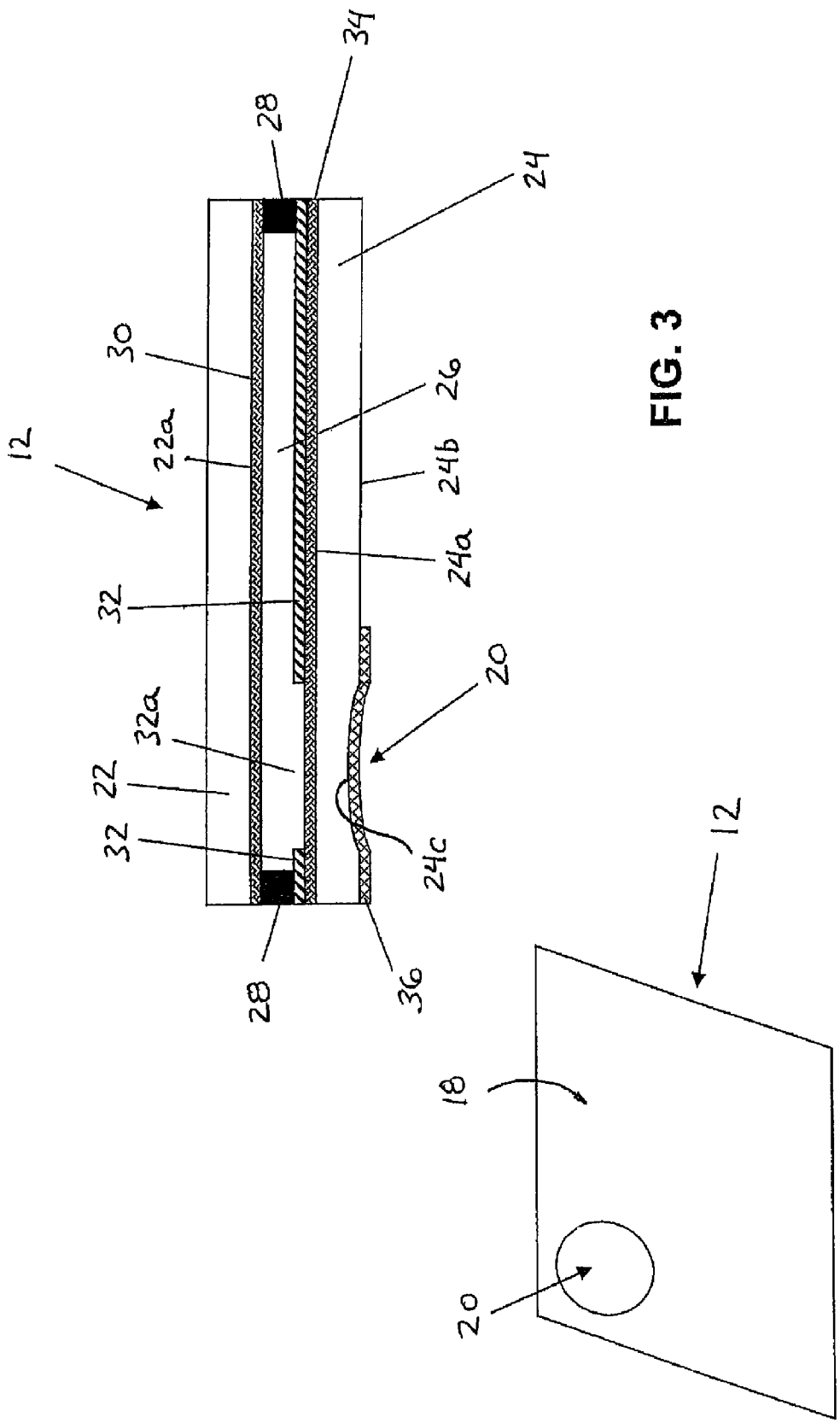

EXTERIOR MIRROR ELEMENT WITH WIDE ANGLE PORTION

CROSS REFERENCE TO RELATED APPLICATIONS

The present application is a continuation of U.S. patent application Ser. No. 12/971,228, filed Dec. 17, 2010, now U.S. Pat. No. 7,934,844, which is a continuation of U.S. patent application Ser. No. 12/893,242, filed Sep. 29, 2010, now U.S. Pat. No. 7,887,204, which is a continuation of U.S. patent application Ser. No. 12/776,780, filed May 10, 2010, now U.S. Pat. No. 7,824,045, which is a continuation of U.S. patent application Ser. No. 12/124,297, filed May 21, 2008, now U.S. Pat. No. 7,748,856, which claims the benefit of U.S. provisional application Ser. No. 60/939,753, filed May 23, 2007, which are hereby incorporated herein by reference in their entireties.

FIELD OF THE INVENTION

The present invention relates to exterior rearview mirror assemblies and, more particularly, to an exterior rearview mirror assembly having an auxiliary wide angle reflector portion or optic for providing the driver with a wider angle rearward field of view as compared to a substantially planar portion of the rearview mirror.

BACKGROUND OF THE INVENTION

It is known to provide a wide angle rearward field of view to a driver of a vehicle via a wide angle reflective element at one or both of the exterior rearview mirror assemblies. Such a wide angle rearward field of view may be provided via a curved mirror reflector, or an auxiliary wide angle reflective element may be provided at a portion of a generally planar mirror reflector, such as via a stick on curved auxiliary reflector element attached to the generally planar mirror reflector. Such add-on curved auxiliary reflectors may be provided at the front surface or first surface (the surface of the mirror reflector that is generally facing rearward and at least partially toward the driver of the vehicle) and provide a reduced image size (as compared to the size of the generally planar reflector) wide angle rearward field of view that is readily viewable by the driver of the vehicle. However, such curved, auxiliary wide angle reflectors are additional components and add to the cost and manufacturing complexity of the mirror assembly. Other auxiliary wide angle reflectors have been proposed, such as those described in U.S. Pat. Nos. 6,315,419; 7,097, 312; and/or 6,522,451, which are hereby incorporated herein by reference in their entireties.

SUMMARY OF THE INVENTION

The present invention provides an exterior rearview mirror reflector or reflective element having a generally planar (or slightly curved) principal reflector portion and an auxiliary wide angle reflector portion integrally formed at the mirror substrate.

According to an aspect of the present invention, an exterior rearview mirror assembly for a vehicle includes a mirror reflective element comprising a mirror substrate having a front surface and a rear surface. The mirror substrate comprises a first reflector portion and a second reflector portion, with the first reflector portion comprising a principal reflector portion of the mirror reflective element. The rear surface of the mirror substrate has a curved recess established thereat, and the second curved reflector portion is established at the curved recess. The curved recess has a radius of curvature that is less than a radius of curvature of the first reflector portion (where the radius of curvature of the first reflector portion may be substantially infinity for a generally flat or planar mirror element or substrate with a generally flat or planar principal reflector portion, or may be a measurable radius for a curved or slightly curved or bent mirror element and/or substrate), whereby the curved recess, when coated by a reflector coating, provides a wide angle auxiliary reflector portion integrally formed with the mirror reflective element (such as by physically removing, such as by grinding or sculpting or physically ablating or the like, a portion of the substrate so as to create or establish a physical dish-shaped convex depression or recess or crater at the surface of the substrate).

The mirror reflective element may comprise an electro-optic mirror reflective element having a first or front mirror substrate and a second or rear mirror substrate and an electro-optic medium disposed therebetween. The curved recess is established at a rear surface of the second or rear mirror substrate. The first reflector portion may comprise a metallic reflector disposed at a front surface of the rear mirror substrate and between the rear mirror substrate and the electro-optic medium. The metallic reflector at the front surface of the rear mirror substrate has a window established thereat, with the window substantially corresponding to a location of the curved recess at the rear surface of the mirror substrate. Optionally, the first reflector portion may comprise a metallic reflector disposed at the rear surface of the rear mirror substrate, with the second reflector portion comprising the metallic reflector disposed at the curved recess.

Therefore, the present invention provides an auxiliary wide angle mirror reflector portion that is integrally formed with the mirror substrate and mirror reflective element. The present invention thus provides an auxiliary wide angle reflector portion without additional components or elements being adhered to the front or rear surface of the reflective element, and thus provides an enhanced mirror reflective element with such an auxiliary wide angle reflector portion. The present invention provides a curved wide angle reflector portion that is behind the first or front surface of the mirror reflective element so that the first or front surface of the mirror reflective element comprises a generally or substantially planar surface with the curved reflector portion established or formed behind and viewable through the generally or substantially planar front surface of the mirror reflective element.

These and other objects, advantages, purposes and features of the present invention will become apparent upon review of the following specification in conjunction with the drawings.

BRIEF DESCRIPTION OF THE DRAWINGS

FIG. 2 is a front elevation of an exterior mirror reflector in accordance with the present invention;

FIG. 3 is a sectional view of the mirror reflector of FIG. 2;

DESCRIPTION OF THE PREFERRED EMBODIMENTS

Figure 1:
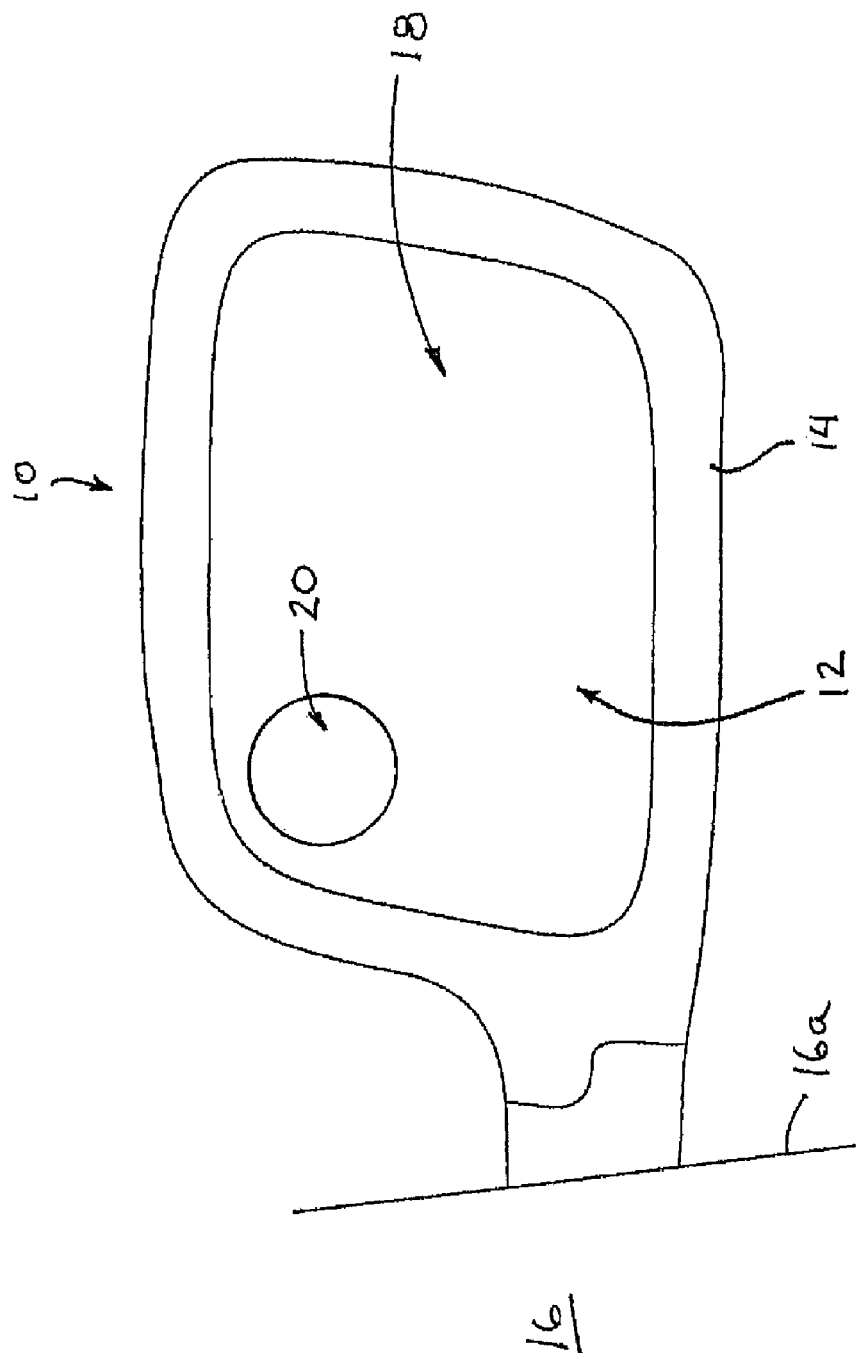
FIG. 1 is a front elevation of an exterior mirror assembly with an auxiliary wide angle reflector in accordance with the present invention, shown as viewed in the direction of travel of the vehicle.

Referring now to the drawings and the illustrative embodiments depicted therein, an exterior rearview mirror assembly 10 for a vehicle includes a mirror reflector or reflective element 12 received in and/or supported by a mirror shell or casing 14 (FIG. 1). Mirror assembly 10 is mounted at the side 16a of a host or subject vehicle 16. Mirror reflector 12 includes a first or principal mirror reflective element portion 18 and a second or auxiliary wide angle reflective element portion or reflective optic 20 integrally formed with the mirror reflector 12, as discussed below. The auxiliary wide angle optic may be integrally formed such as by physically removing, such as by grinding or sculpting or physical ablation or the like, a portion of the substrate so as to create or establish a physical dish-shaped generally convex-shaped depression or recess or crater at the surface of the substrate, and coating the formed depression or recess with a reflector coating or element or the like, as also discussed below.

In the illustrated embodiment, and as shown in FIG. 3, mirror reflector 12 comprises an electro-optic reflective element (but could comprise a non-electro-optic reflective element) having a front substrate 22, a rear substrate 24 and an electro-optic medium 26 (such as a solid polymer matrix electrochromic medium or the like) sandwiched therebetween and sealed via a perimeter seal 28. Front substrate 22 has a transparent conductor coating 30 (such as an indium tin oxide (ITO) coating or layer) disposed at its rear surface 22a, while rear substrate 24 has a mirror reflector or coating 32 (such as a non-dichroic transflector, such as an ITO/Ag/ITO stack of layers or coatings or the like) and a transparent conductor layer 34 (such as an ITO or F-doped or As-doped tin oxide layer or the like) disposed at its front surface 24a. The mirror reflector 12 thus comprises a third surface electro-optic mirror element (such as an electrochromic mirror element). The front and rear substrates 22, 24 may comprise generally planar mirror substrates or may have a slight radius of curvature to provide a wider angle field of view across the principal reflector portion 18 depending on the particular application of the mirror reflective element and exterior rearview mirror assembly.

As shown in FIG. 3, the transparent conductor layer 34 is established or disposed at substantially the entire principal reflecting portion of the reflective element, while the mirror reflector 32 is disposed at the transparent conductor layer 34 and with a window 32a masked or formed through the mirror reflector 32 (such that a window area 32a of the rear substrate is substantially devoid of the mirror reflector coating, while the mirror reflector or coating is present at the other regions of the principal reflecting area of the rear substrate of the reflective element). The window 32a may be formed via any suitable means, such as via masking of the window area during sputter deposition of the mirror reflector 32 or the like, such as via utilizing aspects of the coating processes described in U.S. patent application Ser. No. 11/021,065, filed Dec. 23, 2004 by McCabe et al. for ELECTRO-OPTIC MIRROR CELL, now U.S. Pat. No. 7,255,451, which is hereby incorporated herein by reference in its entirety. The transparent conductor 34 is disposed over substantially the entire front surface 24a of the rear substrate and at the window region so as to provide a conductive layer or surface at the electro-optic medium 26 and over substantially the entire interface between the rear substrate and the electro-optic medium. Thus, electrical conductivity is preserved between the glass substrate and the electro-optic medium across the interface surface of the substrate including at the window region, so as to provide substantially uniform dimming of the mirror reflective element (i.e. darkening of the electro-optic medium) when an electrical voltage is applied to the conductive coatings at the opposed surfaces of the front and rear substrates.

As shown in FIG. 3, rear substrate 24 has the curved auxiliary wide angle mirror reflector portion 20 integrally formed therewith. In the illustrated embodiment, the auxiliary wide angle mirror reflector portion 20 or spotter element comprises a curved (such as convex or spherical or aspherical) formation or depression or recess 24c formed or established (such as via grinding of the rear surface of the glass substrate or other suitable means) at the rear surface 24b of rear substrate 24. The curved recess 24c is integrally formed as part of the rear substrate and is formed at a rear surface location that is generally opposite or generally aligned with the window 32a favored at the mirror reflector 32 at the front surface 24a of the rear substrate 24. A mirror reflector or reflective coating 36 (such as a metallic reflector coating, such as aluminum or silver or chromium or alloys thereof or the like) is disposed or established (such as via sputter deposition or chemical deposition or other establishing means) at the rear or fourth surface 24b of rear substrate 24 and at least at encompassing the curved recess 24c to form the curved spotter or auxiliary wide angle mirror reflector portion 20. Optionally, such as if the reflector coating 36 is environmentally fragile or non-robust, a sealing or protective layer (not shown), such as a lacquer or paint or ink or the like, may be established over the reflector coating to substantially seal the reflector coating and/or to protect the reflector coating.

As shown in FIG. 3, the rear reflector coating 36 may be established substantially only at the curved recess and the region substantially immediately surrounding the curved recess, or the rear reflector coating may cover more of the rear surface of the rear substrate. Optionally, if the mirror reflective element is a transflective display-on-demand type of mirror reflective element, a window or aperture may be formed through the rear reflector coating (such as in applications where the rear reflector coating extends at least partially or substantially over the rear surface of the substrate and at the principal reflecting portion of the mirror reflective element) for a display element or illumination source to project illumination therethrough.

Thus, the auxiliary wide angle mirror reflector portion 20 provides a wide angle rearward field of view to the driver of the vehicle as compared to the field of view provided by the generally planar or slightly curved principal reflecting area or portion 18 of the mirror reflective element 12. The diameter or cross dimension of the wide angle mirror reflector portion and the radius of curvature (with a smaller radius of curvature providing a wider angle rearward field of view) of the wide angle mirror reflector portion 20 are selected to provide the desired wide angle rearward field of view, while being established at a desired or appropriate depth at the rear surface of the rear substrate. The curved recess has a radius of curvature that is smaller and preferably substantially smaller than the radius of curvature of the principal reflector portion, which may have a large radius of curvature that may approach infinity, such as for a slightly curved to generally or substantially planar or flat mirror element.

Figures 4, 5:
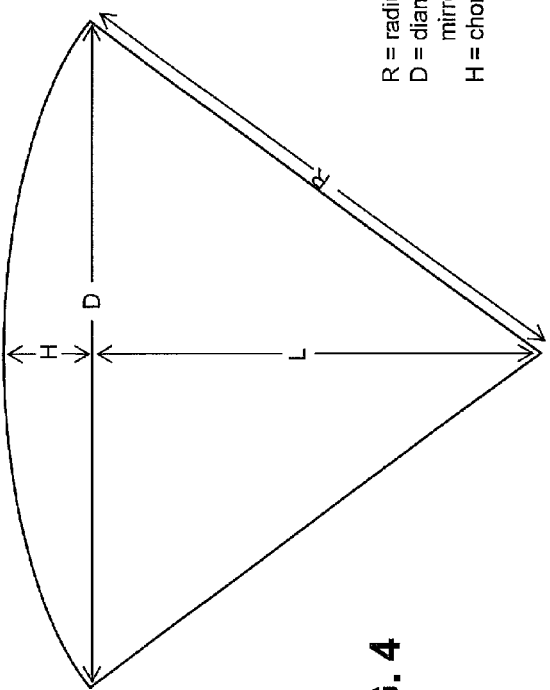
FIG. 4 is a schematic of the curvature of the auxiliary wide angle reflector of the present invention.
FIG. 5 is a table showing dimensions of the auxiliary wide angle reflector for various applications thereof in accordance with the present invention.

As can be seen with reference to FIGS. 4 and 5, for a spherical or convex construction, the diameter or cross dimension or size D (the dimension across the reflective element) of the auxiliary wide angle reflector portion and the radius of curvature R of the wide angle reflector portion determine the depth H of the recess to be formed at the rear surface of the rear substrate. Thus, the thickness of the glass substrate should be selected to have a thickness that allows for the formation of the curved recess at its rear surface while limiting the affect of the curved recess on the structural integrity of the mirror reflective element. If a larger size or cross dimension or diameter (such as about 60 mm to about 80 mm or thereabouts, such as may be used on an exterior rearview mirror for a larger vehicle, such as a truck or the like) of the auxiliary wide angle reflector portion and/or a smaller radius of curvature (such as about 200 mm to about 400 mm or thereabouts) of the auxiliary wide angle reflector portion is/are desired, the glass substrate should be thick enough to have such a recess formed at its rear surface (with the recess possibly being about 1 mm deep to about 4 mm deep or thereabouts) without adversely effecting the structural integrity of the reflective element. For example, and with reference to FIGS. 4 and 5, if a 2 mm thick glass substrate is selected for the reflective element, an auxiliary wide angle reflector having a diameter or cross dimension D of up to about 70 mm could be achieved with a 400 mm radius of curvature R by grinding a curved recess having a chord height or depth H of about 1.53 mm into the rear surface of the substrate and thus leaving about 0.47 mm of glass at the apex of the curved recess.

Although several radii of curvature and diameters/cross dimensions are shown in the table of FIG. 5, clearly other sizes and/or radii of curvature or multiple radii of curvature and/or combinations thereof may be implemented without affecting the scope of the present invention. Optionally, for a given size or diameter of the auxiliary wide angle reflector portion, it may be desirable to provide the smallest radius of curvature of the curved recess (while maintaining the desired structural integrity of the glass substrate and/or reflective element) so as to provide a wider angle rearward field of view to the driver of the vehicle via the auxiliary wide angle reflector portion. Although the radii of curvature and diameters and chord heights or recess depths are shown for spherical formations or constructions, aspherically formed recesses or constructions may be integrally established at the rear surface of the rear substrate to provide other, aspheric or non-uniform wide angle field of views, without affecting the scope of the present invention. For such applications, the depth of the aspheric curved recess should be determined to ensure that the curved recess is not established too deep into rear surface of the glass substrate for the particular applications. Thus, the auxiliary wide angle reflector optic, as viewed through the front surface of the reflective element by a viewer viewing the front or front surface of the reflective element, can be a spherical or aspherical reflector optic, depending on the particular application of the reflective element and mirror assembly and the desired rearward field of view provided by the auxiliary wide angle reflector optic.

Although shown as a generally circular-shaped auxiliary wide angle mirror reflector portion, the auxiliary wide angle mirror reflector portion of the present invention may comprise other shapes and/or may be otherwise located or established at the mirror reflective element, while remaining within the spirit and scope of the present invention. Optionally, the wide angle reflector may comprise a generally convex-shaped reflector, such as a spherically convex shape, or the wide angle reflector may comprise a generally convex-shaped reflector having a compound curvature convex shape, such as a multi-radius shape or aspherical shape or the like. For example, the auxiliary wide angle mirror reflector portion may be formed or sculpted or drilled or ground at a corner or outboard region, preferably an outboard, upper region of the mirror substrate relative to the side of a vehicle to which the mirror would be mounted and viewed by a driver of that vehicle (or elsewhere depending on the particular application), and may comprise a partial circle or partial spherical depression or recess or other shape (such as multi-radius or non-spherical or aspherical shape or segment or such as a rectangular shape that may be curved as a partial cylindrical-shaped recess or the like). Optionally, the wide angle reflector may be formed or sculpted or drilled at the rear surface of the substrate so that the reflector is effectively canted relative to the mirror substrate so as to reflect the wide angle image toward the driver of the vehicle. The rear surface of the corner region of the mirror substrate may be formed or ground or sculpted or otherwise processed to provide the desired shape and/or contour/curvature of the auxiliary reflector portion, and the rear surface of the mirror substrate may be coated or otherwise processed to provide the mirror reflector at the established curved recess at the corner region of the mirror substrate, such as in a similar manner as described above. The wide angle reflector may utilize aspects of the mirror assemblies described in U.S. Pat. Nos. 6,315,419; 7,097,312; and/or 6,522,451; and/or PCT International Publication WO 01/81956 A1 to George E. Platzer Jr. entitled "Compound Automotive Rearview Mirror"; and/or U.S. patent application Ser. No. 11/226,628, filed Sep. 14, 2005 and published Mar. 23, 2006 as U.S. Publication No. US-2006-0061008; and/or Ser. No. 11/912,576, filed Oct. 25, 2007, now U.S. Pat. No. 7,626,749; and/or U.S. provisional applications, Ser. No. 61/050,810, filed May 6, 2008; and/or Ser. No. 61/050,853, filed May 6, 2008, which are hereby incorporated herein by reference in their entireties.

In accordance with what is disclosed in U.S. Pat. No. 6,522,451 (above incorporated herein by reference in its entirety), a plano element and/or a multiradius element can comprise a variable reflectance electro-optic element such as an electrochromic mirror reflector. Thus, both the plano element and the multiradius element can comprise an electrochromic mirror element or either of the plano element and the plano element can comprise an electrochromic mirror element and the other can comprise a fixed reflectance non-variable reflectance mirror element such as a metal reflector coated glass panel such as a chromium coated glass substrate. Also, if both the plano element and the multiradius element comprise an electro-optic element such as an electrochromic mirror element capable of electrically dimmable reflectivity, both elements can dim together and in tandem under control of a common dimming control signal (typically provided by an electro-optic automatic dimming interior mirror assembly mounted in the cabin of the automobile and equipped with photosensors to detect incident glare and ambient light). Alternately, if both the plano element and the multiradius element comprise an electro-optic element such as an electrochromic mirror element capable of electrically dimmable reflectivity, the plano element can dim independently of the multiradius element (such as is disclosed in U.S. Pat. No. 5,550,677, the entire disclosure of which is hereby incorporated by reference herein). If either or both of the elements comprise an electrochromic element, preferably, the electrochromic reflective element comprises a front substrate and a rear substrate with an electrochromic medium disposed between, such as a solid polymer matrix electrochromic medium such as is disclosed in U.S. patent application Ser. No. 09/350,930, filed Jul. 12, 1999, en titled "ELECTROCHROMIC POLYMERIC SOLID FILMS, MANUFACTURING ELECTROCHROMIC DEVICES USING SUCH FILMS, AND PROCESSES FOR MAKING SUCH SOLID FILMS AND DEVICES" to Desaraju V. Varaprasad et al., now U.S. Pat. No. 6,154,306, or such as is disclosed in U.S. Pat. Nos. 5,668,663; 5,724,187; 5,910,854; and 5,239,405, the entire disclosures of which are hereby incorporated by reference herein. Also, although it is preferable to utilize a multiradius or compound curvature reflective element such as an aspherical element or a compound curvature element for the auxiliary mirror element adjacent the plano reflective element (as this enables least discontinuity in image at the joint between the adjacent elements of the assembly), a spherical reflective element (that has substantially only one radius of curvature and, as such, is a section from a sphere) can optionally be used adjacent the plano reflective element instead of, or in addition to, the multiradius reflective element.

In accordance with what is disclosed in U.S. Pat. No. 7,626,749 (above incorporated herein by reference in its entirety), the mirror reflective element may include a wide angle or auxiliary mirror or reflector at a perimeter region or corner region of the reflective element to provide a rearward wide angle view to the driver of the vehicle. The wide angle reflector may be established at the reflective element and behind the fourth surface of the reflective element, such as by utilizing aspects of the reflective elements described in U.S. Pat. No. 6,315,419 and/or U.S. pat. publications, Pub. No. US 2002/0105741, published Aug. 8, 2002; and/or US 2003/0117731, published Jun. 26, 2003; and/or International Pub. No. WO 01/81956, published Nov. 1, 2001, which are all hereby incorporated herein by reference in their entireties. The wide angle reflector may be positioned at a perimeter region of the reflective element so as to provide a wide angle viewing area for viewing the blind spot area at the side and rearward of the vehicle, while the primary or central region of the reflective element provides a generally planar reflective surface for viewing rearward and sideward of the vehicle mirror. The reflective element includes a perimeter band around the perimeter of the reflective element and a perimeter band portion inboard of a wide angle area or region at the reflective element and around an inboard perimeter region of the wide angle reflector. The perimeter band thus separates and/or demarcates the wide angle reflective portion from the generally planar reflective portion of the reflective element, and may conceal or hide the edges of the wide angle reflector. The perimeter band is disposed on the second surface of the front substrate and generally at or along the perimeter seal of the reflective element, while the perimeter band portion is disposed on the second surface and inboard of the seal to generally outline/demarcate an inner perimeter of the wide angle reflector. The perimeter band portion may have generally the same width as the perimeter band, or may have a reduced width or narrow width to reduce the effect on the viewing area of the reflective element. Wide angle reflector is positioned at the rear (or fourth) surface of the rear substrate and may be adhered to the rear surface and generally behind the wide angle area defined by the perimeter band and the perimeter band portion.

In accordance with what is disclosed in PCT International Publication WO 01/81956 A1 (above incorporated herein by reference in its entirety), the auxiliary wide angle mirror portion may be disposed at the second surface of the front substrate of an exterior electrochromic mirror reflective element, and with the electrochromic medium containing electrochromic-active material contacting the auxiliary wide angle mirror portion and disposed between the auxiliary wide angle mirror portion/second surface and a reflector coated rear substrate of the exterior electrochromic mirror reflective element.

Therefore, the mirror reflector or reflective element or transflective electro-optic mirror element of the present invention has an auxiliary wide angle mirror reflector portion established integrally into the rear substrate. The auxiliary mirror reflector portion may be formed or established via grinding a portion of the rear surface of the rear substrate and coating the ground area. The rear surface reflector coating may be established or disposed substantially only at the ground area or curved recess, or may be established or disposed substantially over the entire rear surface of the rear substrate (particularly for applications of the integrally formed wide angle auxiliary mirror reflector portion in fourth surface reflector mirror elements, as discussed below).

Optionally, the integrally formed auxiliary wide angle mirror reflector portion of the present invention may be integrally formed at a rear surface of a fourth surface reflecting electro-optic mirror reflective element, whereby the rear surface mirror reflector disposed at the auxiliary wide angle mirror reflector portion may be established or disposed over substantially the entire rear surface of the rear substrate, with the front surface of the rear substrate having only the transparent conductor layer established thereat. Optionally, the integrally formed auxiliary wide angle mirror reflector portion of the present invention may be integrally formed at a rear surface of non-electro-optic or non-electrochromic reflective element, such as a single substrate mirror reflective element. In such an embodiment, the single substrate may have a mirror reflector or coating established or disposed at its rear surface and at the integrally formed recess of the wide angle mirror reflector portion, such that the rear surface reflector of the mirror reflective element is established over the entire rear surface to form the principal reflector portion of the mirror element and the auxiliary wide angle reflector portion of the mirror element. The single substrate may comprise a generally flat or planar substrate or a slightly curved substrate or a prismatic element or substrate, while remaining within the spirit and scope of the present invention.

Figure 6:
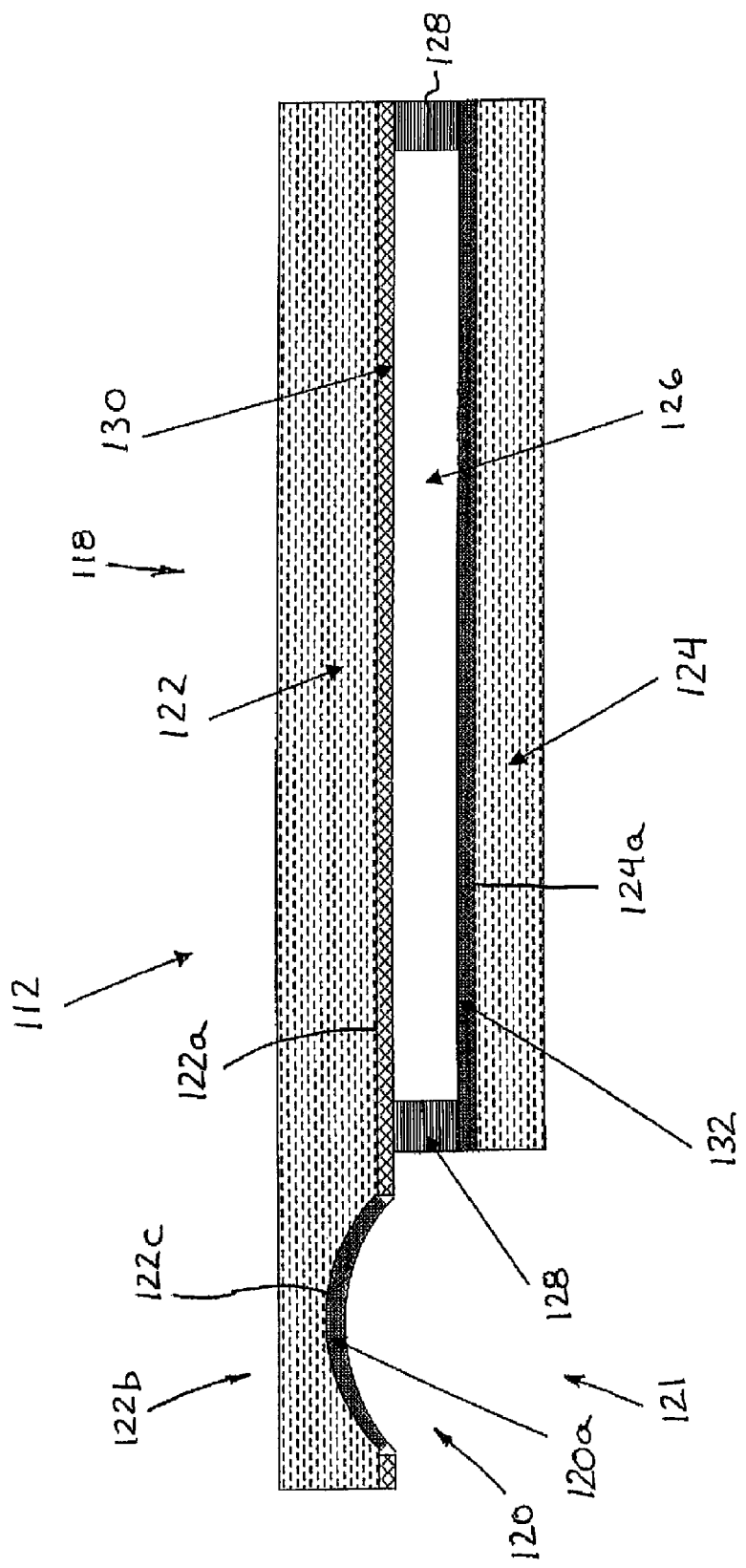
FIG. 6 is a sectional view of another mirror reflector in accordance with the present invention.
Figure 7:
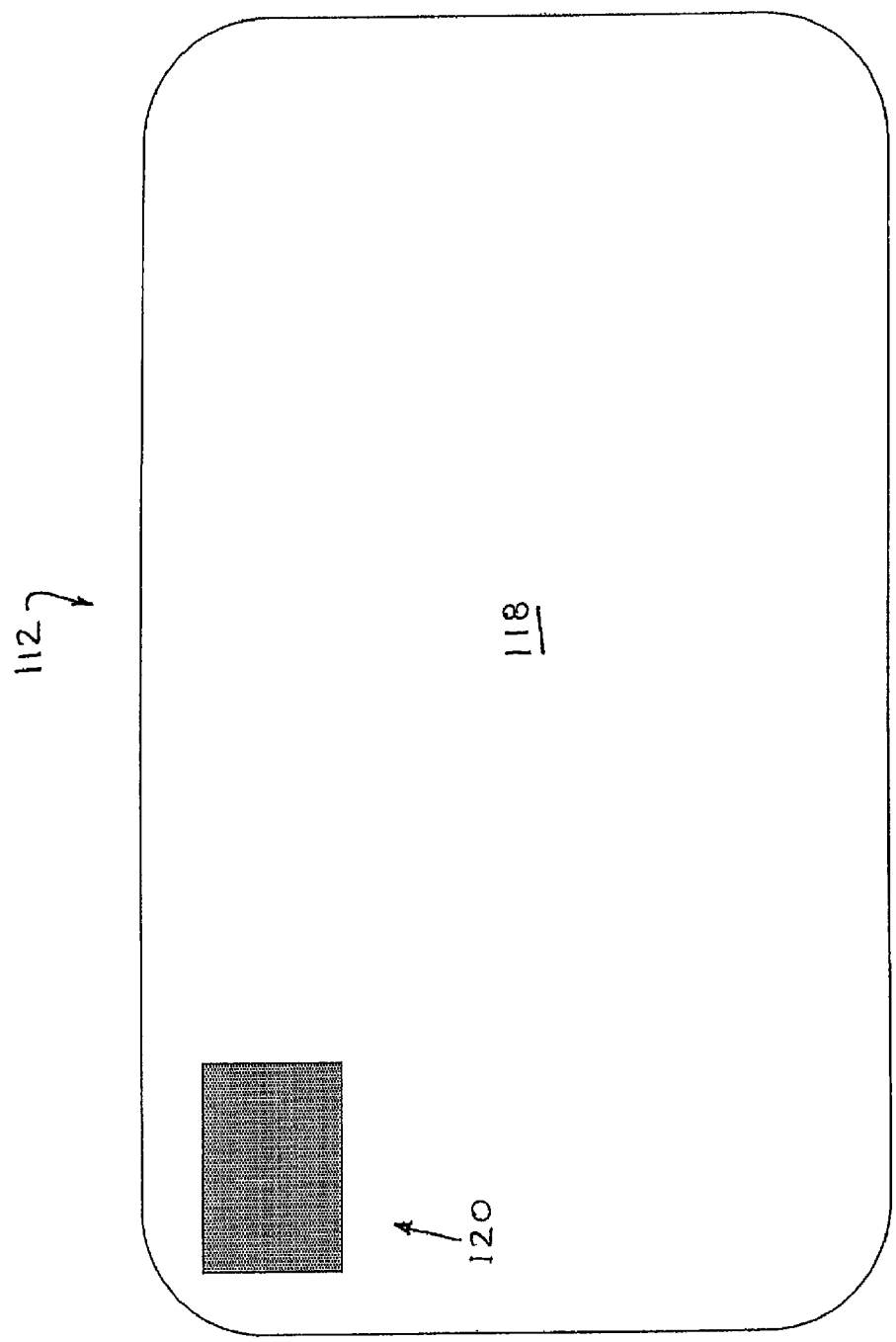
FIG. 7 is a plan view of the mirror reflector of FIG. 6.

Optionally, and as shown in FIGS. 6 and 7, a mirror reflector 112 may comprise an electro-optic reflective element (but could comprise a non-electro-optic reflective element) having a front substrate 122, a rear substrate 124 and an electro-optic medium 126 (such as a solid polymer matrix electrochromic medium or the like) sandwiched therebetween and sealed via a perimeter seal 128. The electrochromic reflective element 112 includes the electrochromic medium 126 sandwiched between the front and rear substrates and at a principal reflecting region 118 of the reflective element 112. In the illustrated embodiment, the rear substrate 124 is cut away or formed to accommodate the wide angle element 120 at a cut-away region 121 (such as in a similar manner as described in U.S. provisional applications, Ser. No. 61/050,810, filed May 6, 2008; and/or Ser. No. 61/050,853, filed May 6, 2008, which are hereby incorporated herein by reference in their entireties) so that the wide angle element 120 is established at the rear surface 122a of the front substrate 122 and at the cut-away region 121 and at a wide angle reflector region 122b of front substrate 122. Thus, the wide angle element may be established at a cutaway region and rearward of the front substrate and adjacent to the electrochromic medium and rear substrate, such that the mirror reflector assembly does not provide a dimming function at the wide angle reflecting region.

In the illustrated embodiment, front substrate 122 has a transparent conductor coating 130 (such as an indium tin oxide (ITO) coating or layer) disposed at its rear surface 122a, while rear substrate 124 has a mirror reflector or coating 132 (such as a non-dichroic transflector, such as an ITO/Ag/ITO stack of layers or coatings or the like, which may include a transparent conductor layer such as an ITO or F-doped or As-doped tin oxide layer or the like) disposed at its front surface 124a. The mirror reflector 112 thus comprises a third surface electro-optic mirror element (such as an electrochromic mirror element) at the principal reflecting region of the reflector that is bounded by the seal 128. The front and rear substrates 122, 124 may comprise generally planar mirror substrates or may have a slight radius of curvature to provide a wider angle field of view across the principal reflector portion 118 depending on the particular application of the mirror reflective element and exterior rearview mirror assembly.

As shown in FIG. 6, front substrate 122 has the curved auxiliary wide angle mirror reflector portion 120 integrally formed therewith. In the illustrated embodiment, the auxiliary wide angle mirror reflector portion 120 or spotter element comprises a curved (such as convex or spherical or aspherical) formation or depression or recess 122c formed or established (such as via grinding of the rear surface of the glass substrate or other suitable physical material removal means) at the rear surface 122a of front substrate 122. The curved recess 122c is integrally formed as part of the front substrate and is formed at a rear surface location that is at the cut-away region 121 of the mirror reflective element assembly. The mirror reflector or reflective coating 120a (such as a metallic reflector coating, such as aluminum or silver or chromium or alloys thereof or the like, and optionally may be similar in materials and/or reflectance to the mirror reflector 132 at front surface 124a of rear substrate 124, but other coatings could be utilized at the wide angle reflector depression 122c at rear surface 122a of front substrate 122) is disposed or established (such as via sputter deposition or chemical deposition or other establishing means) at the rear or second surface 122a of rear substrate 122 and at least at encompassing the curved recess 122c to form the curved spotter or auxiliary wide angle mirror reflector portion 120. Optionally, such as if the reflector coating 120a is environmentally fragile or non-robust, a sealing or protective layer (not shown), such as a lacquer or paint or ink or the like, may be established over the reflector coating to substantially seal the reflector coating and/or to protect the reflector coating.

Thus, when forming the front substrate 122 and the mirror reflector or reflective element assembly 112, the rear surface 122a of front substrate 122 may be coated with the transparent conductor coating 130 (such as across its entire or substantially its entire rear surface), and the rear surface of the extended portion or wide angle region 122b of front substrate 122 may be ground or physically ablated to establish the recess or depression 122c at the rear surface 122a of front substrate 122 (such as by first physically removing the transparent conductor coating 130 at the wide angle region of the front substrate and then physically removing a portion of the substrate to establish the recess or depression at the rear surface of the front substrate). The recess or depression 122c may then be coated with the mirror reflector or coating 120a to establish the wide angle reflector 120 at the overhang region or cut-away region or wide angle reflector region 121 of the mirror reflector 112. Optionally, the wide angle element may utilize aspects of the Platzer-type auxiliary mirrors that follow the teaching of PCT International Publication WO 01/81956 A1 to George E. Platzer Jr. entitled "Compound Automotive Rearview Mirror", the entire disclosure of which is hereby incorporated by reference herein.

Optionally, the front substrate may include a perimeter band and/or demarcating band and/or hiding layer that traverses the front substrate at the wide angle reflecting region to demarcate the wide angle reflecting region from the generally planar or principal reflecting region and optionally to generally circumscribe at least a portion of the wide angle reflector, such as by utilizing aspects of the mirror assemblies described in U.S. Pat. Nos. 7,274,501; 7,184,190; 7,255,451; and/or U.S. patent application Ser. No. 11/226,628, filed Sep. 14, 2005 and published Mar. 23, 2006 as U.S. Publication No. US-2006-0061008; and/or Ser. No. 11/912,576, filed Oct. 25, 2007, now U.S. Pat. No. 7,626,749; and/or U.S. provisional applications, Ser. No. 61/050,853, filed May 6, 2008; and/or Ser. No. 61/050,810, filed May 6, 2008, which are hereby incorporated herein by reference in their entireties. The hiding layer thus may mask or hide from direct view of the driver the seal and/or other components or elements of the mirror reflector assembly construction that are to the rear of the front substrate and in the area of the bordering or hiding layer or element. The hiding layer thus serves as a demarcation element and a hiding or occluding element for the wide angle mirror reflector established at the rear of the glass substrate at the wide angle reflecting region of the mirror reflector assembly. The hiding layer or demarcation element may demarcate or delineate or distinguish or frame the wide angle reflector from the generally planar principal reflecting region of the reflective element to enhance the discernibility of the wide angle reflector at the wide angle reflecting region of the mirror reflector assembly, while hiding the perimeter seal of the electro-optic mirror reflector assembly.

Figure 8:
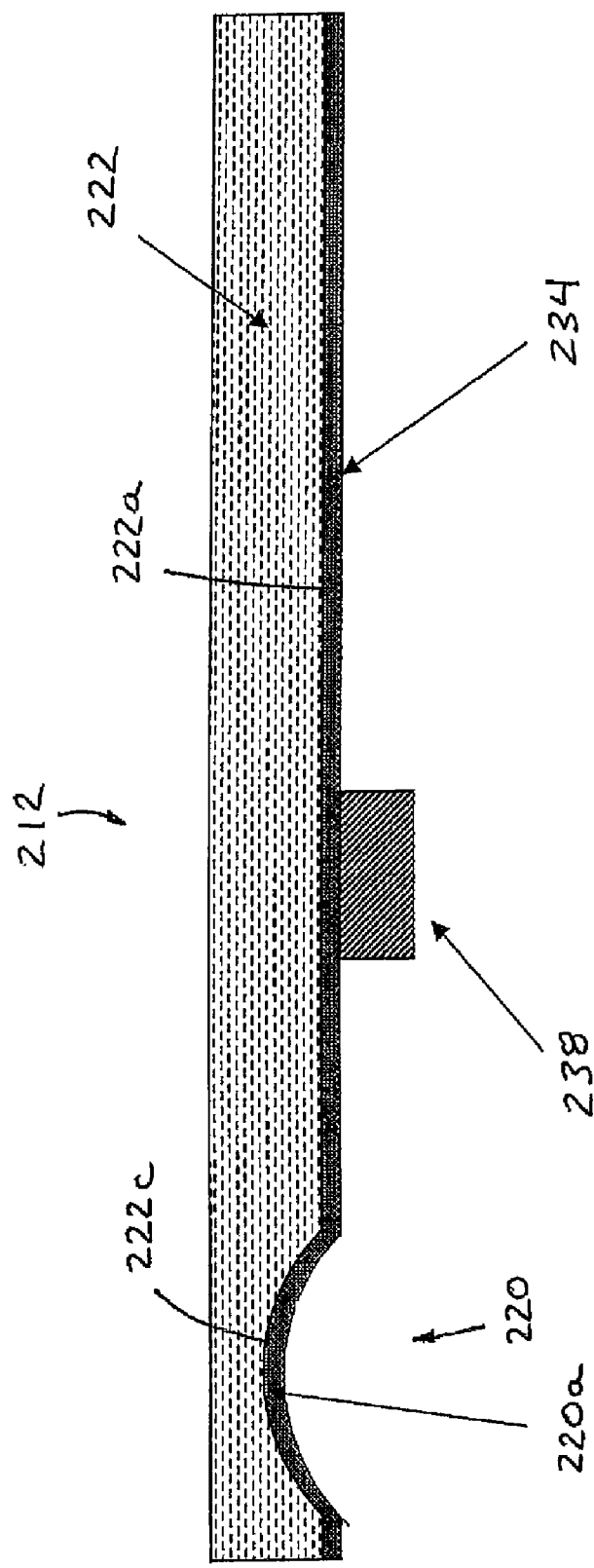
FIG. 8 is a sectional view of another mirror reflector in accordance with the present invention.

Optionally, and as shown in FIG. 8, a non-electro-optic mirror element 212 may include a generally planar substrate 222 with a wide angle reflector 220 established at a rear surface 222a of substrate 222. Substrate 222 has the curved auxiliary wide angle mirror reflector portion 220 integrally formed therewith. In the illustrated embodiment, the auxiliary wide angle mirror reflector portion 220 or spotter element comprises a curved (such as convex or spherical or aspherical) formation or depression or recess 222c formed or established (such as via grinding of the rear surface of the glass substrate or other suitable physical material removal means) at the rear surface 222a of substrate 222.

The rear surface 222a of substrate 222 is coated with a reflector coating 234, such as a transflective reflector coating that is partially light transmissive. The wide angle reflector coating 220a and the principal reflecting coating 234 may comprise the same material (where the substrate may be formed and the depression or recess 222c may be established at the rear surface of the substrate prior to the coating process, which may coat the entire rear surface of the substrate) or may be different materials (or applied in different processes), such as for applications where the substrate is coated with the transflective reflector 234 before the depression or recess 222c is established (by removing the reflector coating and a portion of the substrate), and then the recess 222c is coated with the wide angle reflector coating. In the illustrated embodiment, a display element 238 is disposed to the rear of the substrate 222 and behind the transflective coating 234, whereby display information or illumination emitted by the display element 238 is viewable through the transflective coating and the substrate by a person viewing the front surface of the substrate, while the presence of the display element to the rear of the substrate is rendered covert by the transflective coating when the display element is not activated. Optionally, if a transflective reflector coating is disposed at the recess or depression 222c, it is envisioned that a display element or illumination element or the like may be disposed to the rear of the wide angle reflector 220 so as to be viewable, when activated, through the substrate by a person viewing the front surface of the substrate, while being substantially covert when deactivated.

Therefore, the present invention provides a mirror reflective element with an integrally formed auxiliary wide angle mirror reflector portion and a method of making such a mirror reflective element. For example, the mirror substrate may cut to the desired shape or form, and the rear surface of the substrate may be ground or otherwise processed to form the desired curvature of the recess (such as a spherical or aspherical curvature). The recess may be formed before or after the front surface of the mirror substrate is coated with the transparent conductor and/or the metallic reflector (with the window established thereat, such as via masking during sputter deposition of the metallic reflector or such as via laser ablation of the metallic reflector coating at the window area or the like). The front surface and/or rear surface of the mirror substrate may be coated with the reflector coatings (and optionally, the surfaces may be coated via a two-side sputter deposition process, such as by utilizing aspects described in U.S. patent application Ser. No. 11/021,065, filed Dec. 23, 2004, now U.S. Pat. No. 7,255,451, which is hereby incorporated herein by reference in its entirety) to establish the desired reflector portions of the mirror reflective element. The rear substrate may be assembled to the front substrate (with the electro-optic medium disposed and sealed therebetween) to assemble the mirror reflective element. Optionally, the rear surface of the rear substrate may be ground and/or coated to establish the auxiliary wide angle reflector portion after the mirror reflective element is assembled.

Optionally, conductive electrode coated glass substrates are commercially available from various sources. For example, tin oxide-coated glass substrates, known as "TEC-Glass" products, may be obtained from Libbey-Owens-Ford Co., LOF Glass Division, Toledo, Ohio, and such as described in U.S. Pat. No. 7,004,592, which is hereby incorporated herein by reference in its entirety. Such "TEC-Glass" products are manufactured by an on-line chemical vapor deposition process that pyrolytically deposits onto clear float glass a multi-layer thin film structure, which includes a microscopically thin coating of fluorine-doped tin oxide (having a fine grain uniform structure) with additional undercoating thin film layers disposed between the fluorine-doped tin oxide layer and the underlying glass substrate. The "TEC-Glass" substrates may be available in different thicknesses, such as 2 thick or 3 mm thick glass substrates and/or the like.

Optionally, the mirror assembly and/or mirror reflective element assembly or sub-assembly may include a back plate that includes a perimeter framing portion or bezel portion that extends around the perimeter edges of the reflective element to support the reflective element and frame the reflective element at the mirror assembly (such as by utilizing aspects of the mirror assemblies described in U.S. patent application Ser. No. 11/520,193, filed Sep. 13, 2006, now U.S. Pat. No. 7,581,859, which is hereby incorporated herein by reference in its entirety). The perimeter bezel portion may be narrow or small depending on the particular application of the reflective element and mirror reflector sub-assembly. Optionally, the mirror reflector sub-assembly may comprise a bezeless or frameless reflective element (such as the types described in U.S. Pat. No. 7,184,190; and/or U.S. patent application Ser. No. 11/226,628, filed Sep. 14, 2005 and published. Mar. 23, 2006 as U.S. Publication No. US-2006-0061008; and/or Ser. No. 11/021,065, filed Dec. 23, 2004, now U.S. Pat. No. 7,255, 451, and/or PCT Application No PCT/US2006/01 8567, filed May 15, 2006 by Donnelly Corp. et al., which are hereby incorporated herein by reference in their entireties), whereby the back plate may not include a perimeter framing portion or bezel portion around the perimeter of the reflective element.

Optionally, the mirror assembly may include a heater pad or element at the rear surface of the glass substrate to provide an anti-fogging of de-fogging feature to the exterior mirror assembly (such as by utilizing aspects of the heater elements or pads described in U.S. patent application Ser. No. 11/334, 139, filed Jan. 18, 2006 by Byers et al. for MIRROR ASSEMBLY WITH HEATER ELEMENT, now U.S. Pat. No. 7,400, 435; and/or U.S. provisional applications, Ser. No. 60/853, 850, filed Oct. 24, 2006; Ser. No. 60/918,089, filed Mar. 15, 2007; and/or Set. No. 60/970,687, filed Sep. 7, 2007; and/or PCT Application No. PCT/US07/82099, filed Oct. 22, 2007, which are hereby incorporated herein by reference in their entireties). The back plate and/or heater pad may include suitable electrical connectors and connections incorporated therein (such as by utilizing aspects of the mirror assembly described in U.S. patent application Ser. No. 11/334,139, filed Jan. 18, 2006 by Byers et al. for MIRROR ASSEMBLY WITH HEATER ELEMENT, now U.S. Pat. No. 7,400,435, which is hereby incorporated herein by reference in its entirety) for electrically connecting the heater pad and/or display element (or other suitable electrical connectors may be utilized, such as electrical leads or wire harnesses or pigtails or other separate connectors or cables or the like). The heater pad may conform to the rear surface of the rear substrate and thus may provide heating to the auxiliary wide angle mirror reflector portion, and thus may provide substantially uniform heating of the mirror reflective element over substantially the entire reflecting area of the mirror reflective element, including the integrally formed auxiliary wide angle mirror reflector portion.

As stated above, the reflective element of the rearview mirror assembly may comprise an electro-optic or electrochromic reflective element or cell, such as an electrochromic mirror assembly and electrochromic reflective element utilizing principles disclosed in commonly assigned U.S. Pat. Nos. 7,195,381; 6,690,268; 5,140,455; 5,151,816; 6,178,034; 6,154,306; 6,002,544; 5,567,360; 5,525,264; 5,610,756; 5,406,414; 5,253,109; 5,076,673; 5,073,012; 5,117,346; 5,724,187; 5,668,663; 5,910,854; 5,142,407; and/or 4,712, 879, and/or U.S. patent application Ser. No. 11/021,065, filed Dec. 23, 2004, now U.S. Pat. No. 7,255,451; and/or Ser. No. 11/226,628, filed Sep. 14, 2005 and published Mar. 23, 2006 as U.S. Publication No. US-2006-0061008; and/or PCT Application No. PCT/US2006/018567, filed May 15, 2006 and published Nov. 23, 2006 as International Publication No. WO 2006/124682, and/or European Patent Application No. EP0728618, filed Dec. 8, 1995 and published Aug. 28, 1996; and/or European Patent Application EP0729864, filed Dec. 11, 1995 and published Sep. 4, 1996; and/or Australian Patent Application AU4031795, filed Dec. 11, 1995 and published Feb. 8, 1996, and/or Australian Patent Application AU4031895, filed Dec. 11, 1995 and published Aug. 29, 1996, which are all hereby incorporated herein by reference in their entireties, and/or as disclosed in the following publications: N. R. Lynam, "Electrochromic Automotive Day/Night Mirrors", SAE Technical Paper Series 870636 (1987); N. R. Lynam, "Smart Windows for Automobiles", SAE Technical Paper Series 900419 (1990); N. R. Lynam and A. Agrawal, "Automotive Applications of Chromogenic Materials", Large Area Chromogenics: Materials and Devices for Transmittance Control, C. M. Lampert and C. G. Granquist, EDS., Optical Engineering Press, Wash. (1990), which are hereby incorporated by reference herein in their entireties. The thicknesses and materials of the coatings on the substrates of the electrochromic reflective element, such as on the third surface of the reflective element assembly, may be selected to provide a desired color or tint to the mirror reflective element, such as a blue colored reflector, such as is known in the art and/or such as described in U.S. Pat. Nos. 7,274,501; 5,910,854 and 6,420,036, and in PCT Application No. PCT/US03/29776, filed Sep. 9, 2003 by Donnelly Corp. et al. for MIRROR REFLECTIVE ELEMENT ASSEMBLY, which are all hereby incorporated herein by reference in their entireties.

Optionally, use of an elemental semiconductor mirror, such as a silicon metal mirror, such as disclosed in U.S. Pat. Nos. 6,286,965; 6,196,688; 5,535,056; 5,751,489; and 6,065,840, and/or in U.S. patent application Ser. No. 10/993,302, filed Nov. 19, 2004 by Lynam for MIRROR REFLECTIVE ELEMENT FOR A VEHICLE, now U.S. Pat. No. 7,338,177, which are all hereby incorporated herein by reference in their entireties, can be advantageous because such elemental semiconductor mirrors (such as can be formed by depositing a thin film of silicon) can be greater than 50 percent reflecting in the photopic (SAE J964a measured), while being also substantially transmitting of light (up to 20 percent or even more). Such silicon mirrors also have the advantage of being able to be deposited onto a flat glass substrate and to be bent into a curved (such as a convex or aspheric) curvature, which is also advantageous since many passenger-side exterior rearview mirrors are bent or curved.

Optionally, the reflective element may include a perimeter metallic band, such as the types described in U.S. Pat. No. 7,184,190; and/or PCT Application No. PCT/US03/29776, filed Sep. 19, 2003 by Donnelly Corp. et al. for ELECTRO-CHROMIC MIRROR ASSEMBLY; and/or PCT Application No. PCT/US03/35381, filed Nov. 5, 2003 by Donnelly Corp. et al. for ELECTRO-OPTIC REFLECTIVE ELEMENT ASSEMBLY; and/or U.S. pat. applications; Ser. No. 11/021,065, filed Dec. 23, 2004 by McCabe et al. for ELECTRO-OPTIC MIRROR CELL, now U.S. Pat. No. 7,255,451; Ser. No. 11/226,628, filed Sep. 14, 2005 and published Mar. 23, 2006 as U.S. Publication No. US-2006-0061008, which are all hereby incorporated herein by reference in their entireties. Optionally, the reflective element may include indicia formed at and viewable at the reflective element, such as by utilizing aspects of the reflective elements described in PCT Application No. PCT/US2006/018567, filed May 15, 2006; and U.S. provisional applications, Ser. No. 60/681,250, filed May 16, 2005; Ser. No. 60/690,400, filed Jun. 14, 2005; Ser, No. 60/695,149, filed Jun. 29, 2005; Ser. No. 60/730,334, filed Oct. 26, 2005; Ser. No. 60/750,199, filed Dec. 14, 2005; Ser. No. 60/774,449, filed Feb. 17, 2006; and Ser. No. 60/783,496, filed Mar. 18, 2006, which are all hereby incorporated herein by reference in their entireties.

Optionally, the reflective element may comprise a single substrate with a reflective coating at its rear surface. The mirror assembly thus may comprise a prismatic mirror assembly or planar or non-planar mirror or other mirror having a single substrate reflective element, such as a mirror assembly utilizing aspects of the mirror assemblies described in U.S. Pat. Nos. 6,318,870; 6,598,980; 5,327,288; 4,948, 242; 4,826,289; 4,436,371; and 4,435,042; and PCT Application No. PCT/US04/015424, filed May 18, 2004 by Donnelly Corporation et al. for MIRROR ASSEMBLY FOR VEHICLE; and U.S. patent application Ser. No. 10/933,842, filed Sep. 3, 2004, now U.S. Pat. No. 7,249,860, which are hereby incorporated herein by reference in their entireties. Optionally, the reflective element may comprise a conventional prismatic or flat reflective element or prism, or may comprise a prismatic or flat reflective element of the types described in PCT Application No. PCT/US03/29776, filed Sep. 19, 2003 by Donnelly Corp. et al. for MIRROR REFLECTIVE ELEMENT ASSEMBLY; U.S. patent application Ser. No. 10/709,434, filed May 5, 2004 by Lynam for MIRROR REFLECTIVE ELEMENT, now U.S. Pat. No. 7,420,756; Ser. No. 10/933,842, filed Sep. 3, 2004 by Kulas et al. for INTERIOR REARVIEW MIRROR ASSEMBLY, now U.S. Pat. No. 7,249,860; Ser. No. 11/021,065, filed Dec. 23, 2004 by McCabe et al. for ELECTRO-OPTIC MIRROR CELL, now U.S. Pat. No. 7,255,451; and/or Ser. No. 10/993, 302, filed Nov. 19, 2004 by Lynam for MIRROR REFLECTIVE ELEMENT FOR A VEHICLE, now U.S. Pat. No. 7,338,177, and/or PCT Application No. PCT/US2004/015424, filed May 18, 2004 by Donnelly Corp. et al. for MIRROR ASSEMBLY FOR VEHICLE, which are all hereby incorporated herein by reference in their entireties.

Optionally, the mirror assembly may include one or more displays, such as the types disclosed in U.S. Pat. Nos. 5,530, 240 and/or 6,329,925, which are hereby incorporated herein by reference in their entireties, and/or display-on-demand or transflective type displays, such as the types disclosed in U.S. Pat. Nos. 7,184,190; 7,195,381; 6,690,268; 5,668,663 and/or 5,724,187, and/or in U.S. patent application Ser. No. 10/528, 269, filed Mar. 17, 2005, now U.S. Pat. No. 7,274,501; Ser. No. 10/538,724, filed Jun. 13, 2005 and published Mar. 9, 2006 as U.S. Publication No. US-2006-0050018; Ser. No. 11/284,543, filed Nov. 22, 2005, now U.S. Pat. No. 7,370, 983; and/or Ser. No. 11/021,065, filed Dec. 23, 2004 by McCabe et al. for ELECTRO-OPTIC MIRROR CELL, now U.S. Pat. No. 7,255,451; and/or PCT Application No. PCT/US03/29776, filed Sep. 9, 2003 by Donnelly Corp, et al. for MIRROR REFLECTIVE ELEMENT ASSEMBLY; and/or PCT Application No. PCT/US03/35381, filed Nov. 5, 2003 by Donnelly Corp. et al. for ELECTRO-OPTIC REFLECTIVE ELEMENT ASSEMBLY; and/or PCT Application No. PCT/US03/40611, filed Dec. 19, 2003 by Donnelly Corp. et al. for ACCESSORY SYSTEM FOR VEHICLE, which are all hereby incorporated herein by reference in their entireties, or may include or incorporate video displays or the like, such as the types described in PCT Application No. PCT/US03/40611, filed Dec. 19, 2003 by Donnelly Corp. et al. for ACCESSORY SYSTEM FOR VEHICLE, and/or U.S. patent application Ser. No. 10/538,724, filed Jun. 13, 2005 and published Mar. 9, 2006 as U.S. Publication No. US-2006-0050018; and/or Ser. No. 11/284,543, filed Nov. 22, 2005, now U.S. Pat. No. 7,370,983; and/or U.S. provisional applications, Ser. No. 60/630,061, filed Nov. 22, 2004 by Lynam et al. for MIRROR ASSEMBLY WITH VIDEO DISPLAY; and Ser. No. 60/667,048, filed Mar. 31, 2005 by Lynam et al. for MIRROR ASSEMBLY WITH VIDEO DISPLAY, which are hereby incorporated herein by reference in their entireties.

Optionally, the mirror reflective element may comprise a transflective display on demand reflective element that is partially transmissive and partially reflective, so that the light emanating from the display element may be transmitted through the reflective element when an illumination source is activated, but the display is substantially non-visible or viewable when the illumination source is deactivated. Optionally, the mirror reflective element may comprise a single substrate or non-electro-optic reflective element, with the auxiliary wide angle reflector portion being integrally formed or established at a rear surface of the reflective element, while remaining within the spirit and scope of the present invention. For example, the reflective element may utilize aspects of the reflective elements described in U.S. Pat. Nos. 7,184,190; 6,690,268; 5,668,663 and/or 5,724,187, and/or in U.S. patent application Ser. No. 10/993,302, filed Nov. 19, 2004 by Lynam for MIRROR REFLECTIVE ELEMENT FOR A VEHICLE, now U.S. Pat. No. 7,338,177; Ser. No. 10/528,269, filed Mar. 17, 2005, now U.S. Pat. No. 7,274,501; and/or Ser. No. 11/021,065, filed Dec. 23, 2004 by McCabe et al. for ELECTRO-OPTIC MIRROR CELL, now U.S. Pat. No. 7,255,451, which are all hereby incorporated herein by reference in their entireties.

Optionally, the mirror assembly may include a blind spot indicator and/or a turn signal indicator, such as an indicator or indicators of the types described in U.S. provisional applications, Ser. No. 60/853,850, filed Oct. 24, 2006; and/or Ser. No. 60/918,089, filed Mar. 15, 2007; and/or Set No. 60/970,687, filed Sep. 7, 2007; and/or PCT Application No. PCT/US07/82099, filed Oct. 22, 2007; and/or U.S. Pat. Nos. 6,198,409; 5,929,786; and 5,786,772, and/or PCT Application No. PCT/US2006/026148, filed Jul. 5, 2006 by Donnelly Corp. et al. for VEHICLE EXTERIOR MIRROR ASSEMBLY WITH BLIND SPOT INDICATOR, which are hereby incorporated herein by reference in their entireties. The signal indicator or indication module may include or utilize aspects of various light modules or systems or devices, such as the types described in U.S. Pat. Nos. 6,227,689; 6,582,109; 5,371,659; 5,497,306; 5,669,699; 5,823,654; 6,176,602; and/or 6,276,821, and/or U.S. patent application Ser. No. 11/520,193, filed Sep. 13, 2006, now U.S. Pat. No. 7,581,859, and/or PCT Application No. PCT/US2006/018567, filed May 16, 2006, which are hereby incorporated herein by reference in their entireties.

Such an indicator or indicators may function as a lane change assist (LCA) indicator or indicators and/or a blind spot indicator or indicators. Such blind spot indicators are typically activated when an object is detected (via a side object or blind spot detection system or the like such as described in U.S. Pat. Nos. 7,038,577; 6,882,287; 6,198,409; 5,929,786; and 5,786,772, and/or U.S. patent application Ser. No. 11/315,675, filed Dec. 22, 2005 by Higgins-Luthman for OBJECT DETECTION SYSTEM FOR VEHICLE, now U.S. Pat. No. 7,720,580; and/or PCT Application No. PCT/US2006/026148, filed Jul. 5, 2006 by Donnelly Corp. et al. for VEHICLE EXTERIOR MIRROR ASSEMBLY WITH BLIND SPOT INDICATOR, which are hereby incorporated herein by reference in their entireties) at the side and/or rear of the vehicle (at the blind spot) and when the turn signal is also activated, so as to provide an alert to the driver of the host vehicle that there is an object or vehicle in the lane next to the host vehicle at a time when the driver of the host vehicle intends to move over into the adjacent lane. Optionally, and alternately, the indicator or indicators may function as a lane change assist indicator or indicators, where the host vehicle may be detected to be moving into an adjacent lane without the turn signal being activated, and an object or vehicle may be detected at the adjacent lane, whereby the LCA indicator or indicators may be activated to provide an alert to the driver of the lane change to assist the driver in avoiding unintentional lane changes and/or lane changes when a vehicle or object is detected in the adjacent lane.

The blind spot indicators thus may be operable to provide an indication to the driver of the host vehicle that an object or other vehicle has been detected in the lane or area adjacent to the side of the host vehicle. The blind spot indicator may be operable in association with a blind spot detection system, which may include an imaging sensor or sensors, or an ultrasonic sensor or sensors, or a sonar sensor or sensors or the like. For example, the blind spot detection system may utilize aspects of the blind spot detection and/or imaging systems described in U.S. Pat. Nos. 7,038,577; 6,882,287; 6,198,409; 5,929,786; and/or 5,786,772, and/or U.S. patent application Ser. No. 11/239,980, filed Sep. 30, 2005 by Camilleri et al. for VISION SYSTEM FOR VEHICLE; and/or Ser. No. 11/315,675, filed Dec. 22, 2005 by Higgins-Luthman for OBJECT DETECTION SYSTEM FOR VEHICLE, now U.S. Pat. No. 7,720,580, and/or U.S. provisional applications, Ser. No. 60/638,687, filed Dec. 23, 2004 by Higgins-Luthman for OBJECT DETECTION SYSTEM FOR VEHICLE; Ser. No. 60/628,709, filed Nov. 17, 2004 by Camilleri et al. for IMAGING AND DISPLAY SYSTEM FOR VEHICLE; Ser. No. 60/614,644, filed Sep. 30, 2004; and/or Ser. No. 60/618,686, filed Oct. 14, 2004 by Laubinger for VEHICLE IMAGING SYSTEM, and/or of the reverse or backup aid systems, such as the rearwardly directed vehicle vision systems described in U.S. Pat. Nos. 5,550,677; 5,760,962; 5,670,935; 6,201,642; 6,396,397; 6,498,620; 6,717,610 and/or 6,757,109, and/or U.S. patent application Ser. No. 10/418,486, filed Apr. 18, 2003 by McMahon et al. for VEHICLE IMAGING SYSTEM, now U.S. Pat. No. 7,005,974, and/or of the automatic headlamp controls described in U.S. Pat. Nos. 5,796,094 and/or 5,715,093; and/or U.S. patent application Ser. No. 11/105,757, filed Apr. 14, 2005 by Schofield et al. for IMAGING SYSTEM FOR VEHICLE, now U.S. Pat. No. 7,526,103; and/or U.S. provisional application Ser. No. 60/607,963, filed Sep. 8, 2004 by Schofield for IMAGING SYSTEM FOR VEHICLE, and/or of the rain sensors described in U.S. Pat. Nos. 6,250,148 and 6,341,523, and/or of other imaging systems, such as the types described in U.S. Pat. Nos. 6,353,392 and 6,313,454, which may utilize various imaging sensors or imaging array sensors or cameras or the like, such as a CMOS imaging array sensor, a CCD sensor or other sensors or the like, such as the types disclosed in commonly assigned, U.S. Pat. Nos. 5,550,677; 5,760,962; 6,097,023 and 5,796,094, and U.S. patent application Ser. No. 09/441,341, filed Nov. 16, 1999 by Schofield et al. for VEHICLE HEADLIGHT CONTROL USING IMAGING SENSOR, now U.S. Pat. No. 7,339,149, and/or PCT Application No. PCT/US2003/036177 filed Nov. 14, 2003, published Jun. 3, 2004 as PCT Publication No. WO 2004/047421 A3, with all of the above referenced U.S. patents, patent applications and provisional applications and PCT applications being commonly assigned and being hereby incorporated herein by reference in their entireties.

The constructions of the present invention are economical and effective compared to the more complicated and potentially more costly constructions of other mirror assemblies. For example, no additional elements or reflectors need be positioned at the front or rear surface of the reflective element, since the auxiliary reflector portion is integrally formed and/or established at the reflective element during manufacture of the reflective element.

Changes and modifications to the specifically described embodiments may be carried out without departing from the principles of the present invention, which is intended to be limited only by the scope of the appended claims as interpreted according to the principles of patent law.

The invention claimed is:

1. An electrochromic mirror reflective element suitable for use in an exterior rearview mirror assembly of a vehicle, said electrochromic mirror reflective element comprising:

a front glass substrate having a first surface and a second surface;

a rear glass substrate having a third surface and a fourth surface;

an electrochromic medium disposed between said front and rear glass substrates, wherein said electrochromic medium is bounded by a seal and wherein said electrochromic medium comprises electrochromic material;

said electrochromic mirror reflective element comprising a principal planar reflector portion and an auxiliary wide angle curved portion;

wherein said principal planar reflector portion comprises a principal mirror reflector disposed at said rear glass substrate;

wherein said auxiliary wide angle curved portion comprises one of (a) a curved recess established at a region of said second surface of said front glass substrate by at least one of grinding and ablating and (b) a curved recess established at a region of said fourth surface of said rear glass substrate by at least one of grinding and ablating;

wherein said auxiliary wide angle curved portion comprises an auxiliary mirror reflector coated at said curved recess;

wherein said first surface of said front glass substrate comprises a generally planar surface;

wherein said third surface of said rear glass substrate comprises a generally planar surface;

wherein said curved recess has a cross-dimension size that is in the range from about 30 millimeters to about 80 millimeters;

wherein said curved recess comprises a radius of curvature that is in the range from about 200 millimeters to about 1,000 millimeters;

wherein said curved recess has a maximum recess depth that is in the range from about 0.11 millimeters to about 4.04 millimeters; and wherein said electrochromic medium disposed between said second surface of said front glass substrate and said third surface of said rear glass substrate is in contact with said principal planar reflector portion and with said auxiliary wide angle curved portion.

2. The electrochromic mirror reflective element of claim 1, wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element.

3. The electrochromic mirror reflective element of claim 2, wherein said curved recess is generally circular-shaped and comprises a spherical convex-curved surface.

4. The electrochromic mirror reflective element of claim 3, wherein said spherically curved and generally circular-shaped recess has a maximum recess depth H that is a function of its radius of curvature R and its cross-dimension size D.

5. The electrochromic mirror reflective element of claim 4, wherein:

$$H = R - (R^2 - (D/2)^2)^{0.5}.$$

6. The electrochromic mirror reflective element of claim 1, wherein said auxiliary wide angle curved portion comprises a curved recess established at a region of said second surface of said front glass substrate by at least one of grinding and ablating.

7. The electrochromic mirror reflective element of claim 6, wherein said seal at least one of (a) circumscribes the perimeter of said front and rear glass substrates and (b) circumscribes the perimeter of said front and rear glass substrates and at least partially circumscribes said auxiliary wide angle curved portion.

8. The electrochromic mirror reflective element of 1, wherein said seal circumscribes the perimeter of said front and rear glass substrates and wherein said electrochromic mirror reflective element further comprises a hiding layer that substantially hides said seal from view by the driver of the vehicle when an exterior rearview mirror assembly equipped with said electrochromic mirror reflective element is normally mounted at the vehicle and the driver is normally operating the vehicle, and wherein said hiding layer is disposed at said second surface of said front glass substrate.

9. The electrochromic mirror reflective element of claim 8, wherein, when a voltage is applied to said electrochromic medium of said electrochromic mirror reflective element, (a) said electrochromic medium dims to reduce reflectivity of visible light at said principal planar reflector portion and (b) visible light reflectivity at said auxiliary wide angle curved portion is substantially unchanged.

10. The electrochromic mirror reflective element of claim 1, wherein a hiding layer at least in part demarcates said auxiliary wide angle curved portion from said principal planar reflector portion when an exterior rearview mirror assembly equipped with said electrochromic mirror reflective element is normally mounted at the vehicle and is normally viewed by the driver of the vehicle.

11. The electrochromic mirror reflective element of claim 1, wherein said auxiliary wide angle curved portion comprises a curved recess established at a region of said second surface of said front glass substrate by grinding.

12. The electrochromic mirror reflective element of claim 1, wherein said electrochromic medium is sandwiched between said front and rear glass substrates at said principal planar reflector portion and at said auxiliary wide angle curved portion, and wherein, when a voltage is applied to said electrochromic medium of said electrochromic mirror reflective element, said electrochromic medium dims to reduce reflectivity of visible light at said principal planar reflector portion.

13. The electrochromic mirror reflective element of claim 12, further comprising a hiding layer that at least one of (a) substantially hides said seal from view by the driver of the vehicle when an exterior rearview mirror assembly equipped with said electrochromic mirror reflective element is normally mounted at the vehicle and (b) at least partially circumscribes said auxiliary wide angle curved portion.

14. The electrochromic mirror reflective element of claim 13, wherein said hiding layer is disposed at said second surface of said front glass substrate.

15. The electrochromic mirror reflective element of claim 1, wherein said auxiliary wide angle curved portion comprises a curved recess established at a region of said fourth surface of said rear glass substrate by at least one of grinding and ablating.

16. The electrochromic mirror reflective element of claim 15, wherein said seal at least one of (a) circumscribes the perimeter of said front and rear glass substrates and (b) circumscribes the perimeter of said front and rear glass substrates and at least partially circumscribes said auxiliary wide angle curved portion.

17. The electrochromic mirror reflective element of claim 15, wherein said seal circumscribes the perimeter of said front and rear glass substrates and wherein said electrochromic mirror reflective element further comprises a hiding layer that substantially hides said seal from view by the driver of the vehicle when an exterior rearview mirror assembly equipped with said electrochromic mirror reflective element is normally mounted at the vehicle and the driver is normally operating the vehicle.

18. The electrochromic mirror reflective element of claim 17, wherein said hiding layer is disposed at said second surface of said front glass substrate.

19. The electrochromic mirror reflective element of claim 15, wherein said electrochromic medium is sandwiched between said front and rear glass substrates at said principal planar reflector portion and at said auxiliary wide angle curved portion, and wherein, when a voltage is applied to said electrochromic medium of said electrochromic mirror reflective element, said electrochromic medium dims to reduce reflectivity of visible light at said principal planar reflector.

20. The electrochromic mirror reflective element of claim 15, wherein, when a voltage is applied to said electrochromic medium of said electrochromic mirror reflective element, (a) said electrochromic medium dims to reduce reflectivity of visible light at said principal planar reflector portion and (b) visible light reflectivity at said auxiliary wide angle curved portion is substantially unchanged.

21. The electrochromic mirror reflective element of claim 20, wherein said seal circumscribes the perimeter of said front and rear glass substrates, and wherein a hiding layer substantially hides the portion of said seal that circumscribes said perimeter of said front and rear glass substrates from view by the driver of the vehicle when an exterior rearview mirror assembly equipped with said electrochromic mirror reflective element is normally mounted at the vehicle and the driver is normally operating the vehicle, and wherein said hiding layer is disposed at said second surface of said front glass substrate.

22. The electrochromic mirror reflective element of claim 21, wherein said principal mirror reflector of said principal planar reflector portion disposed at said rear glass substrate is disposed at said third surface of said rear glass substrate between said rear glass substrate and said electrochromic medium, and wherein said principal mirror reflector of said principal planar reflector portion disposed at said third surface of said rear glass substrate comprises a light-transmitting aperture, and wherein said light-transmitting aperture substantially corresponds to said auxiliary wide angle curved portion of said electrochromic mirror reflective element.

23. The electrochromic mirror reflective element of claim 22, wherein said curved recess is established at said region of said fourth surface of said rear glass substrate by grinding.

24. The electrochromic mirror reflective element of claim 1, wherein said auxiliary wide angle curved portion comprises a curved recess established at a region of said second surface of said front glass substrate by at least one of grinding and ablating, and wherein said auxiliary mirror reflector comprises a metallic reflector coating, and wherein a transparent conductor coating is disposed at said generally planar surface of said second surface of said front glass substrate and wherein said transparent conductor coating abuts said auxiliary mirror reflector and wherein said transparent conductor coating surrounds said auxiliary mirror reflector, and wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess.

25. The electrochromic mirror reflective element of claim 1, wherein said principal mirror reflector of said principal planar reflector portion comprises at least one of aluminum, silver, chromium, an aluminum alloy, a silver alloy and a chromium alloy, and wherein said auxiliary mirror reflector of said auxiliary wide angle curved portion comprises at least another of aluminum, silver, chromium, an aluminum alloy, a silver alloy and a chromium alloy.

26. The electrochromic mirror reflective element of claim 1, wherein said auxiliary mirror reflector of said auxiliary wide angle curved portion is coated at said curved recess via sputter deposition.

27. The electrochromic mirror reflective element of claim 26, wherein said electrochromic medium is sandwiched between said front and rear glass substrates at said principal planar reflector portion and at said auxiliary wide angle curved portion, and wherein, when a voltage is applied to said electrochromic medium of said electrochromic mirror reflective element, said electrochromic medium dims to reduce reflectivity of visible light at said principal planar reflector.

28. The electrochromic mirror reflective element of claim 1, wherein said auxiliary wide angle curved portion comprises a curved recess established at a region of said second surface of said front glass substrate by at least one of grinding and ablating, and wherein said front glass substrate has a thickness between said first surface and said second surface of less than 3 millimeters, and wherein said curved recess has a maximum recess depth that is in the range from about 0.11 millimeters to about 1.57 millimeters.

29. The electrochromic mirror reflective element of claim 28, wherein said cross-dimension size of said curved recess is in the range from about 30 millimeters to about 50 millimeters.

30. The electrochromic mirror reflective element of claim 28, wherein said curved recess is generally circular-shaped and comprises a spherical convex-curved surface, and wherein said spherically curved and generally circular-shaped recess has a maximum recess depth that is a function of its radius of curvature and its cross-dimension size.

31. The electrochromic mirror reflective element of claim 1, wherein said auxiliary wide angle curved portion comprises a curved recess established at a region of said fourth surface of said rear glass substrate by at least one of grinding and ablating, and wherein said curved recess has a maximum recess depth that is in the range from about 0.11 millimeters to about 1.57 millimeters.

32. The electrochromic mirror reflective element of claim 31, wherein said cross-dimension size of said curved recess is in the range from about 30 millimeters to about 50 millimeters.

33. The electrochromic mirror reflective element of claim 1, wherein said principal mirror reflector of said principal planar reflector portion disposed at said rear glass substrate is disposed at said third surface of said rear glass substrate between said rear glass substrate and said electrochromic medium.

34. The electrochromic minor reflective element of claim 33, wherein said principal mirror reflector of said principal planar reflector portion disposed at said third surface of said rear glass substrate comprises a metallic reflector coated via sputter deposition.

35. The electrochromic minor reflective element of claim 33, wherein said auxiliary wide angle curved portion comprises a curved recess established at a region of said fourth surface of said rear glass substrate by at least one of grinding and ablating, and wherein said curved recess has a maximum recess depth that is in the range from about 0.11 millimeters to about 1.57 millimeters, and wherein said principal mirror reflector of said principal planar reflector portion at said third surface of said rear glass substrate comprises a light-transmitting aperture, and wherein said light-transmitting aperture substantially corresponds to said auxiliary wide angle curved portion of said electrochromic mirror reflective element.

36. The electrochromic mirror reflective element of claim 1, wherein, when a voltage is applied to said electrochromic medium of said electrochromic mirror reflective element, (a) said electrochromic medium dims to reduce reflectivity of visible light at said principal planar reflector portion and (b) visible light reflectivity at said auxiliary wide angle curved portion is substantially unchanged.

37. The electrochromic mirror reflective element of claim 36, further comprising a hiding layer that at least partially circumscribes said auxiliary wide angle curved portion.

38. The electrochromic mirror reflective element of claim 37, wherein said hiding layer is disposed at said second surface of said front glass substrate.

39. The electrochromic mirror reflective element of claim 1, wherein said auxiliary mirror reflector coated at said curved recess of said auxiliary wide angle curved portion comprises a generally convex-shaped reflector having a compound curvature convex shape.

40. The electrochromic mirror reflective element of claim 1, wherein, when an exterior rearview mirror assembly equipped with said electrochromic mirror reflective element is normally mounted at the side of a vehicle, said auxiliary wide angle curved portion is generally disposed at an outboard upper region of said electrochromic mirror reflective element relative to the side of the vehicle.

41. The electrochromic mirror reflective element of claim 1, wherein said front glass substrate has a thickness between said first surface and said second surface that allows said curved recess to be a least about 0.5 millimeters deep.

42. The electrochromic mirror reflective element of claim 41, wherein said front glass substrate has a thickness between said first surface and said second surface that allows said curved recess to be no greater than about 4 millimeters deep.

43. The electrochromic mirror reflective element of claim 1, wherein said front glass substrate has a thickness between said first surface and said second surface that allows said curved recess to have a depth in the range from about 0.5 millimeters deep and to about 4 millimeters deep, and wherein said front glass substrate has a thickness between said first surface and said second surface of less than 3 millimeters.

44. The electrochromic mirror reflective element of claim 1, wherein said front glass substrate has a thickness between said first surface and said second surface of less than 3 millimeters.

45. The electrochromic mirror reflective element of claim 44, wherein said curved recess has a maximum recess depth that is in the range from about 0.11 millimeters to about 2.26 millimeters.

46. The electrochromic mirror reflective element of claim 1, wherein said auxiliary wide angle curved portion comprises a curved recess established at a region of said second surface of said front glass substrate by at least one of grinding and ablating, and wherein said principal planar reflector portion comprises a principal mirror reflector established at said third surface of said rear glass substrate, and wherein said auxiliary mirror reflector comprises a metallic reflector coating and wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess, and wherein said curved recess is generally circular-shaped.

47. The electrochromic mirror reflective element of claim 1, wherein said auxiliary wide angle curved portion comprises a curved recess established at a region of said second surface of said front glass substrate by at least one of grinding and ablating, and wherein a transparent conductor coating is disposed at said generally planar surface of said second surface of said front glass substrate.

48. The electrochromic mirror reflective element of claim 47, wherein said transparent conductor coating abuts said auxiliary mirror reflector.

49. The electrochromic mirror reflective element of claim 48, wherein said transparent conductor coating at least partially circumscribes said auxiliary mirror reflector.

50. The electrochromic mirror reflective element of claim 48, wherein said transparent conductor coating surrounds said auxiliary mirror reflector.

51. The electrochromic mirror reflective element of claim 50, wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element as viewed through said front glass substrate.

52. The electrochromic mirror reflective element of claim 51, wherein said transparent conductor coating comprises indium tin oxide.

53. The electrochromic mirror reflective element of claim 51, wherein said curved recess is established at said region of said second surface of said front glass substrate by grinding before said transparent conductor coating is disposed at said generally planar surface of said second surface of said front glass substrate and before said auxiliary mirror reflector is established at said curved recess.

54. The electrochromic mirror reflective element of claim 1, wherein said auxiliary wide angle curved portion comprises a curved recess established at a region of said second surface of said front glass substrate by at least one of grinding and ablating, and wherein a transparent conductor coating is disposed at said generally planar surface of said second surface of said front glass substrate and wherein said transparent conductor coating abuts said auxiliary mirror reflector, and wherein said transparent conductor coating surrounds said auxiliary mirror reflector.

55. The electrochromic mirror reflective element of claim 54, wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element as viewed through said front glass substrate.

56. The electrochromic mirror reflective element of claim 54, wherein said curved recess is established at said region of said second surface of said front glass substrate by at least one of grinding and ablating before said transparent conductor coating is disposed at said generally planar surface of said second surface of said front glass substrate.

57. An electrochromic mirror reflective element suitable for use in an exterior rearview mirror assembly of a vehicle, said electrochromic mirror reflective element comprising:
   a front glass substrate having a first surface and a second surface;
   a rear glass substrate having a third surface and a fourth surface;
   an electrochromic medium disposed between said second surface of said front glass substrate and said third surface of said rear glass substrate;

said electrochromic medium bounded by a seal, said seal joining said front glass substrate to said rear glass substrate and wherein said electrochromic medium comprises electrochromic material;

a principal planar reflector portion and an auxiliary wide angle curved portion;

wherein said principal planar reflector portion comprises a principal mirror reflector established at said third surface of said rear glass substrate;

wherein said auxiliary wide angle curved portion comprises a curved recess established at a region of said second surface of said front glass substrate by at least one of grinding and ablating;

wherein said auxiliary wide angle curved portion comprises an auxiliary mirror reflector established at said curved recess;

wherein said first surface of said front glass substrate comprises a generally planar surface;

wherein, other than at said curved recess, said second surface of said front glass substrate comprises a generally planar surface;

wherein said third surface of said rear glass substrate comprises a generally planar surface;

wherein said fourth surface of said rear glass substrate comprises a generally planar surface;

wherein said curved recess has a cross-dimension size that is less than or equal to about 80 millimeters;

wherein said curved recess comprises a radius of curvature that is in the range from about 200 millimeters to about 1,000 millimeters;

wherein said curved recess has a maximum recess depth that is in the range from about 0.11 millimeters to about 4.04 millimeters; and wherein said electrochromic medium disposed between said second surface of said front glass substrate and said third surface of said rear glass substrate is in contact with said principal planar reflector portion and with said auxiliary wide angle curved portion.

58. The electrochromic mirror reflective element of claim 57, wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element as viewed through said front glass substrate.

59. The electrochromic mirror reflective element of claim 58, wherein said curved recess is generally circular-shaped.

60. The electrochromic mirror reflective element of claim 59, wherein said curved recess comprises a spherical convex-curved surface.

61. The electrochromic mirror reflective element of claim 60, wherein said spherically curved and generally circular-shaped recess has a maximum recess depth H that is a function of its radius of curvature R and its cross-dimension size D.

62. The electrochromic mirror reflective element of claim 61, wherein:

$$H = R - (R^2 - (D/2)^2)^{0.5}.$$

63. The electrochromic mirror reflective element of claim 57, wherein said curved recess is established at said region of said second surface of said front glass substrate by grinding.

64. The electrochromic mirror reflective element of claim 57, wherein said principal mirror reflector of said principal planar reflector portion comprises a first metallic coating and wherein said auxiliary mirror reflector of said auxiliary wide angle curved portion comprises a second metallic coating that is different from said first metallic coating.

65. The electrochromic mirror reflective element of claim 57, wherein said auxiliary mirror reflector comprises a metallic reflector coating, and wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess.

66. The electrochromic mirror reflective element of claim 65, wherein said metallic reflector coating of said auxiliary mirror reflector comprises chromium.

67. The electrochromic mirror reflective element of claim 65, wherein said metallic reflector coating of said auxiliary mirror reflector of said auxiliary wide angle curved portion is established at said curved recess via sputter deposition.

68. The electrochromic mirror reflective element of claim 57, wherein said front glass substrate has a thickness between said first surface and said second surface that allows said curved recess to be a least about 0.5 millimeters deep.

69. The electrochromic mirror reflective element of claim 57, wherein said front glass substrate has a thickness between said first surface and said second surface that allows said curved recess to be no greater than about 4 millimeters deep.

70. The electrochromic mirror reflective element of claim 57, wherein said front glass substrate has a thickness between said first surface and said second surface that allows said curved recess to have a depth in the range from about 0.5 millimeters deep and to about 4 millimeters deep.

71. The electrochromic mirror reflective element of claim 70, wherein said front glass substrate has a thickness between said first surface and said second surface of about 2 millimeters.

72. The electrochromic mirror reflective element of claim 57, wherein said front glass substrate has a thickness between said first surface and said second surface of less than 3 millimeters.

73. The electrochromic mirror reflective element of claim 57, wherein said curved recess has a maximum recess depth that is in the range from about 0.11 millimeters to about 2.26 millimeters.

74. The electrochromic mirror reflective element of claim 73, wherein said cross-dimension size of said curved recess is in the range from about 30 millimeters to about 60 millimeters.

75. The electrochromic mirror reflective element of claim 57, wherein said curved recess is generally circular-shaped and comprises a spherical convex-curved surface.

76. The electrochromic minor reflective element of claim 75, wherein said spherically curved and generally circular-shaped recess has a maximum recess depth that is a function of its radius of curvature and its cross-dimension size.

77. The electrochromic mirror reflective element of claim 57, wherein said curved recess is established at said region of said second surface of said front glass substrate by grinding, and wherein said curved recess has a maximum recess depth that is in the range from about 0.11 millimeters to about 2.26 millimeters, and wherein said cross-dimension size of said curved recess is in the range from about 30 millimeters to about 60 millimeters.

78. The electrochromie mirror reflective element of claim 57, wherein said principal mirror reflector of said principal planar reflector portion comprises a metallic reflector that is established at said third surface of said rear glass substrate via sputter deposition.

79. The electrochromic mirror reflective element of claim 57, wherein said auxiliary mirror reflector established at said curved recess of said auxiliary wide angle curved portion comprises a generally convex-shaped reflector having a compound curvature convex shape.

80. The electrochromic mirror reflective element of claim 57, wherein, when a voltage is applied to said electrochromic medium, said electrochromic medium dims to reduce reflectivity of visible light at said principal planar reflector portion and visible light reflectivity at said auxiliary wide angle curved portion is substantially unchanged.

81. The electrochromic mirror reflective element of claim 57, wherein said electrochromic medium is sandwiched between said first and rear glass substrates at said auxiliary wide angle curved portion.

82. The electrochromic mirror reflective element of claim 57, wherein a transparent conductor coating is disposed at said generally planar surface of said second surface of said front glass substrate.

83. The electrochromic mirror reflective element of claim 82, wherein said transparent conductor coating abuts said auxiliary mirror reflector.

84. The electrochromic mirror reflective element of claim 83, wherein said transparent conductor coating at least partially circumscribes said auxiliary mirror reflector.

85. The electrochromic mirror reflective element of claim 84, wherein said transparent conductor coating surrounds said auxiliary mirror reflector.

86. The electrochromic mirror reflective element of claim 85, wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element as viewed through said front glass substrate.

87. The electrochromic mirror reflective element of claim 86, wherein said transparent conductor coating comprises indium tin oxide.

88. The electrochromic mirror reflective element of claim 85, wherein said curved recess is established at said region of said second surface of said front glass substrate by grinding before said transparent conductor coating is disposed at said generally planar surface of said second surface of said front glass substrate and before said auxiliary mirror reflector is established at said curved recess.

89. The electrochromic mirror reflective element of claim 57, wherein said curved recess of said auxiliary wide angle curved portion comprises an aspheric curved recess.

90. The electrochromic mirror reflective element of claim 57, wherein said curved recess is established at said region of said second surface of said front glass substrate by grinding and wherein said curved recess is canted relative to said principal planar reflector portion of said electrochromic mirror reflective element.

91. An electrochromic mirror reflective element suitable for use in an exterior rearview mirror assembly of a vehicle, said electrochromic mirror reflective element comprising:
  a front glass substrate having a first surface and a second surface;
  a rear glass substrate having a third surface and a fourth surface;
  an electrochromic medium disposed between said second surface of said front glass substrate and said third surface of said rear glass substrate;
  said electrochromic medium bounded by a seal, said seal joining said front glass substrate to said rear glass substrate;
  a principal planar reflector portion and an auxiliary wide angle curved portion;
  wherein said principal planar reflector portion comprises a principal mirror reflector established at said third surface of said rear glass substrate;
  wherein said auxiliary wide angle curved portion comprises a curved recess established at a region of said second surface of said front glass substrate by at least one of grinding and ablating;
  wherein said auxiliary wide angle curved portion comprises an auxiliary mirror reflector established at said curved recess;
  wherein said first surface of said front glass substrate comprises a generally planar surface;
  wherein, other than at said curved recess, said second surface of said front glass substrate comprises a generally planar surface;
  wherein said third surface of said rear glass substrate comprises a generally planar surface;
  wherein said fourth surface of said rear glass substrate comprises a generally planar surface;
  wherein said curved recess has a cross-dimension size that is less than or equal to about 80 millimeters;
  wherein said curved recess comprises a radius of curvature that is in the range from about 200 millimeters to about 1,000 millimeters;
  wherein said curved recess has a maximum recess depth that is in the range from about 0.11 millimeters to about 4.04 millimeters;
  wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element as viewed through said front glass substrate;
  wherein said curved recess is generally circular-shaped;
  wherein said auxiliary mirror reflector comprises a metallic reflector coating;
  wherein said electrochromic medium disposed between said second surface of said front glass substrate and said third surface of said rear glass substrate is in contact with said principal planar reflector portion and with said auxiliary wide angle curved portion; and
  wherein, when a voltage is applied to said electrochromic medium, said electrochromic medium dims to reduce reflectivity of visible light at said principal planar reflector portion and visible light reflectivity at said auxiliary wide angle curved portion is substantially unchanged.

92. The electrochromic mirror reflective element of claim 91, wherein said curved recess comprises a spherical convex-curved surface and wherein said spherically curved and generally circular-shaped recess has a maximum recess depth H that is a function of its radius of curvature R and its cross-dimension size D wherein:

$$H = R - (R^2 - (D/2)^2)^{0.5}.$$

93. The electrochromic mirror reflective element of claim 92, wherein said curved recess is established at said region of said second surface of said front glass substrate by grinding, and wherein said front glass substrate has a thickness between said first surface and said second surface that allows said curved recess to have a depth in the range from about 0.5 millimeters deep and to about 3.09 millimeters deep.

94. The electrochromic mirror reflective element of claim 93, wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess.

95. The electrochromic mirror reflective element of claim 91, wherein said curved recess is established at said region of said second surface of said front glass substrate by grinding, and wherein said curved recess has a maximum recess depth that is in the range from about 0.11 millimeters to about 2.26 millimeters, and wherein said cross-dimension size of said curved recess is in the range from about 30 millimeters to about 60 millimeters.

96. The electrochromic mirror reflective element of claim 95, wherein said front glass substrate has a thickness between said first surface and second surface of less than 3 millimeters.

97. The electrochromic mirror reflective element of claim 91, wherein said principal mirror reflector of said principal planar reflector portion comprises a metallic reflector that is established at said third surface of said rear glass substrate via sputter deposition, and wherein said electrochromic medium is sandwiched between said first and rear glass substrates at said auxiliary wide angle curved portion.

98. The electrochromic mirror reflective element of claim 91, wherein a transparent conductor coating is disposed at said generally planar surface of said second surface of said front glass substrate and wherein said transparent conductor coating abuts said auxiliary mirror reflector, and wherein said transparent conductor coating surrounds said auxiliary mirror reflector.

99. The electrochromic mirror reflective element of claim 98, wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element as viewed through said front glass substrate.

100. The electrochromic mirror reflective element of claim 91, wherein said curved recess is established at said region of said second surface of said front glass substrate by at least one of grinding and ablating before a transparent conductor coating is disposed at said generally planar surface of said second surface of said front glass substrate.

101. The electrochromic mirror reflective element of claim 91, wherein said curved recess is established at said region of said second surface of said front glass substrate by grinding, and wherein said curved recess is canted relative to said principal planar reflector portion of said electrochromic mirror reflective element.

102. An electrochromic mirror reflective element suitable for use in an exterior rearview mirror assembly of a vehicle, said electrochromic mirror reflective element comprising:
  a front glass substrate having a first surface and a second surface;
  a rear glass substrate having a third surface and a fourth surface;
  an electrochromic medium disposed between said second surface of said front glass substrate and said third surface of said rear glass substrate;
  said electrochromic medium bounded by a seal, said seal joining said front glass substrate to said rear glass substrate;
  a principal planar reflector portion and an auxiliary wide angle curved portion;
  wherein said principal planar reflector portion comprises a principal mirror reflector established at said third surface of said rear glass substrate;
  wherein said auxiliary wide angle curved portion comprises a curved recess established at a region of said second surface of said front glass substrate by at least one of grinding and ablating;
  wherein said auxiliary wide angle curved portion comprises an auxiliary mirror reflector established at said curved recess;
  wherein said first surface of said front glass substrate comprises a generally planar surface;
  wherein, other than at said curved recess, said second surface of said front glass substrate comprises a generally planar surface;
  wherein said third surface of said rear glass substrate comprises a generally planar surface;
  wherein said fourth surface of said rear glass substrate comprises a generally planar surface;
  wherein said curved recess has a cross-dimension size that is less than or equal to about 80 millimeters;
  wherein said curved recess comprises a radius of curvature that is in the range from about 200 millimeters to about 1,000 millimeters;
  wherein said curved recess has a maximum recess depth that is in the range from about 0.11 millimeters to about 4.04 millimeters;
  wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element as viewed through said front glass substrate;
  wherein said auxiliary mirror reflector comprises a metallic reflector coating;
  wherein, when a voltage is applied to said electrochromic medium, said electrochromic medium dims to reduce reflectivity of visible light at said principal planar reflector portion and visible light reflectivity at said auxiliary wide angle curved portion is substantially unchanged;
  wherein said electrochromic medium disposed between said second surface of said front glass substrate and said third surface of said rear glass substrate is in contact with said principal planar reflector portion and with said auxiliary wide angle curved portion; and
  wherein a transparent conductor coating is disposed at said generally planar surface of said second surface of said front glass substrate and wherein said transparent conductor coating abuts said auxiliary mirror reflector and wherein said transparent conductor coating surrounds said auxiliary mirror reflector.

103. The electrochromic mirror reflective element of claim 102, wherein said front glass substrate has a thickness between said first surface and said second surface of less than 3 millimeters.

104. The electrochromic mirror reflective element of claim 103, wherein at least one of (i) said curved recess is generally circular-shaped, (ii) said curved recess comprises a spherical convex-curved surface, (iii) said curved recess is generally circular-shaped and said curved recess comprises a spherical convex-curved surface, (iv) said curved recess comprises an aspherical convex-curved surface, (v) said curved recess comprises a compound curved convex-curved surface and (vi) said curved recess is canted relative to said principal planar reflector portion of said electrochromic mirror reflective element.

105. The electrochromic mirror reflective element of claim 102, wherein said front glass substrate has a thickness between said first surface and said second surface that allows said curved recess to have depth in the range from about 0.5 millimeters deep and to about 2.26 millimeters deep.

106. The electrochromic mirror reflective element of claim 105, wherein said cross-dimension size of said curved recess is in the range from about 30 millimeters to about 60 millimeters.

107. The electrochromic mirror reflective element of claim 106, wherein said electrochromic medium is sandwiched between said first and rear glass substrates at said auxiliary wide angle curved portion.

108. The electrochromic mirror reflective element of claim 107, wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess.

109. The electrochromic mirror reflective element of claim 108, wherein said curved recess is established at said region of said second surface of said front glass substrate by grinding before said transparent conductor coating is disposed at said generally planar surface of said second surface of said front glass substrate.

110. An electrochromic mirror reflective element suitable for use in an exterior rearview mirror assembly of a vehicle, said electrochromic mirror reflective element comprising:
  a front glass substrate having a first surface and a second surface;
  a rear glass substrate having a third surface and a fourth surface;
  an electrochromic medium disposed between said second surface of said front glass substrate and said third surface of said rear glass substrate;
  said electrochromic medium bounded by a seal, said seal joining said front glass substrate to said rear glass substrate;
  a principal planar reflector portion and an auxiliary wide angle curved portion;
  wherein said principal planar reflector portion comprises a principal mirror reflector established at a surface of said rear glass substrate;
  wherein said auxiliary wide angle curved portion comprises a curved recess established at a region of said second surface of said front glass substrate by at least one of grinding and ablating;
  wherein said auxiliary wide angle curved portion comprises an auxiliary mirror reflector established at said curved recess;
  wherein said first surface of said front glass substrate comprises a generally planar surface;
  wherein, other than at said curved recess, said second surface of said front glass substrate comprises a generally planar surface;
  wherein said third surface of said rear glass substrate comprises a generally planar surface;
  wherein said fourth surface of said rear glass substrate comprises a generally planar surface;
  wherein said auxiliary wide angle curved portion is inboard of a perimeter edge of said electrochromic mirror reflective element, and wherein said principal planar reflector portion of said electrochromic mirror reflective element surrounds said auxiliary wide angle curved portion of said electrochromic mirror reflective element as viewed through said front glass substrate;
  wherein said auxiliary mirror reflector comprises a metallic reflector coating;
  wherein a transparent conductor coating is disposed at said generally planar surface of said second surface of said front glass substrate and wherein said transparent conductor coating abuts said auxiliary mirror reflector and wherein said transparent conductor coating surrounds said auxiliary mirror reflector;
  wherein at least one of (i) said curved recess is generally circular-shaped, (ii) said curved recess comprises a spherical convex-curved surface, (iii) said curved recess is generally circular-shaped and said curved recess comprises a spherical convex-curved surface, (iv) said curved recess comprises an aspherical convex-curved surface, (v) said curved recess comprises a compound curved convex-curved surface and (vi) said curved recess is canted relative to said principal planar reflector portion of said electrochromic mirror reflective element;
  wherein said electrochromic medium disposed between said second surface of said front glass substrate and said third surface of said rear glass substrate is in contact with said principal planar reflector portion and with said auxiliary wide angle curved portion;
  wherein said front glass substrate has a thickness between said first surface and said second surface that allows said curved recess to have a depth in the range from about 0.5 millimeters deep and to about 3.09 millimeters deep;
  wherein said curved recess comprises a radius of curvature that is in the range from about 200 millimeters to about 1,000 millimeters; and
  wherein said curved recess has a maximum recess depth that is in the range from about 0.5 millimeters to about 3.09 millimeters.

111. The electrochromic mirror reflective element of claim 110, wherein said front glass substrate has a thickness between said first surface and said second surface of less than 3 millimeters.

112. The electrochromic mirror reflective element of claim 111, wherein said curved recess has a cross-dimension size that is in the range from about 30 millimeters to about 80 millimeters and wherein said curved recess is generally circular-shaped and wherein said curved recess comprises a spherical convex-curved surface.

113. The electrochromic mirror reflective element of claim 112, wherein said curved recess is established at said region of said second surface of said front glass substrate by at least one of grinding and ablating before said transparent conductor coating is disposed at said generally planar surface of said second surface of said front glass substrate.

114. The electrochromic mirror reflective element of claim 111, wherein said metallic reflector coating is coated at said curved recess and at a generally planar surface region of said second surface of said front glass substrate immediately adjacent said curved recess, and wherein the portion of said metallic reflector coating coated at said curved recess is contiguous with the portion of said metallic reflector coating coated at said generally planar surface region of said second surface of said front glass substrate immediately adjacent said curved recess.

115. The electrochromic mirror reflective element of claim 114, wherein, when a voltage is applied to said electrochromic medium, said electrochromic medium dims to reduce reflectivity of visible light at said principal planar reflector portion and visible light reflectivity at said auxiliary wide angle curved portion is substantially unchanged.

116. An electrochromic mirror reflective element suitable for use in an exterior rearview mirror assembly of a vehicle, said electrochromic mirror reflective element comprising:
   a front glass substrate having a first surface and a second surface;
   a rear glass substrate having a third surface and a fourth surface;
   an electrochromic medium disposed between said second surface of said front glass substrate and said third surface of said rear glass substrate;
   said electrochromic medium bounded by a seal, said seal joining said front glass substrate to said rear glass substrate;
   a principal planar reflector portion and an auxiliary wide angle curved portion;
   wherein said principal planar reflector portion comprises a principal mirror reflector established at a surface of said rear glass substrate;
   wherein said auxiliary wide angle curved portion comprises a curved recess established at a region of said second surface of said front glass substrate by at least one of grinding and ablating;
   wherein said auxiliary wide angle curved portion comprises an auxiliary mirror reflector established at said curved recess;
   wherein said first surface of said front glass substrate comprises a generally planar surface;
   wherein, other than at said curved recess, said second surface of said front glass substrate comprises a generally planar surface;
   wherein said third surface of said rear glass substrate comprises a generally planar surface;
   wherein said fourth surface of said rear glass substrate comprises a generally planar surface;
   wherein said curved recess has a cross-dimension size that is less than or equal to about 80 millimeters;
   wherein said curved recess comprises a radius of curvature that is in the range from about 200 millimeters to about 1,000 millimeters;
   wherein said curved recess has a maximum recess depth that is in the range from about 0.11 millimeters to about 4.04 millimeters;
   wherein said electrochromic medium disposed between said second surface of said front glass substrate and said third surface of said rear glass substrate is in contact with said principal planar reflector portion and with said auxiliary wide angle curved portion;
   wherein said auxiliary wide angle curved portion is inboard of a perimeter edge of said electrochromic mirror reflective element and wherein said principal planar reflector portion of said electrochromic mirror reflective element surrounds said auxiliary wide angle curved portion of said electrochromic mirror reflective element as viewed through said front glass substrate;
   wherein said auxiliary mirror reflector comprises a metallic reflector coating; and
   wherein a transparent conductor coating is disposed at said generally planar surface of said second surface of said front glass substrate.

117. The electrochromic mirror reflective element of claim 116, wherein said curved recess comprises a spherical convex-curved surface, and wherein said curved recess has a depth in the range from about 0.5 millimeters deep and to about 3.09 millimeters deep.

118. The electrochromic mirror reflective element of claim 116, wherein said curved recess has a maximum recess depth that is in the range from about 0.11 millimeters to about 2.26 millimeters, and wherein said cross-dimension size of said curved recess is in the range from about 30 millimeters to about 60 millimeters, and wherein said metallic reflector coating of said principal mirror reflector of said principal planar reflector portion is established via sputter deposition and wherein said front glass substrate has a thickness between said first surface and said second surface of less than 3 millimeters.

119. The electrochromic mirror reflective element of claim 116, and wherein said transparent conductor coating abuts said auxiliary mirror reflector and wherein said transparent conductor coating surrounds said auxiliary mirror reflector, and wherein said curved recess is established at said region of said second surface of said front glass substrate by at least one of grinding and ablating before said transparent conductor coating is disposed at said generally planar surface of said second surface of said front glass substrate.

120. The electrochromic mirror reflective element of claim 116, wherein said principal planar reflector portion comprises a principal mirror reflector established at said third surface of said rear glass substrate, and wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess, and wherein said curved recess is generally circular-shaped.

121. An electrochromic mirror reflective element suitable for use in an exterior rearview mirror assembly of a vehicle, said electrochromic mirror reflective element comprising:
   a front glass substrate having a first surface and a second surface;
   a rear glass substrate having a third surface and a fourth surface;
   an electrochromic medium disposed between said second surface of said front glass substrate and said third surface of said rear glass substrate;
   said electrochromic medium bounded by a seal, said seal joining said front glass substrate to said rear glass substrate;
   a principal planar reflector portion and an auxiliary wide angle curved portion;
   wherein said principal planar reflector portion comprises a principal mirror reflector established at a surface of said rear glass substrate;
   wherein said auxiliary wide angle curved portion comprises a curved recess established at a region of said second surface of said front glass substrate by at least one of grinding and ablating;
   wherein said auxiliary wide angle curved portion comprises an auxiliary mirror reflector established at said curved recess;

wherein said first surface of said front glass substrate comprises a generally planar surface;
wherein, other than at said curved recess, said second surface of said front glass substrate comprises a generally planar surface;
wherein said third surface of said rear glass substrate comprises a generally planar surface;
wherein said fourth surface of said rear glass substrate comprises a generally planar surface;
wherein said curved recess has a cross-dimension size has a cross-dimension size that is less than or equal to about 80 millimeters;
wherein said curved recess comprises a radius of curvature that is in the range from about 200 millimeters to about 1,000 millimeters;
wherein said front glass substrate has a thickness between said first surface and said second surface of less than 3 millimeters;
wherein said auxiliary wide angle curved portion is inboard of a perimeter edge of said electrochromic mirror reflective element and wherein said principal planar reflector portion of said electrochromic mirror reflective element surrounds said auxiliary wide angle curved portion of said electrochromic mirror reflective element as viewed through said front glass substrate;
wherein said auxiliary mirror reflector comprises a metallic reflector coating;
wherein a transparent conductor coating is disposed at said generally planar surface of said second surface of said front glass substrate;
wherein said curved recess has a depth of at least about 0.5 millimeters deep;
wherein said transparent conductor coating abuts said auxiliary mirror reflector and wherein said transparent conductor coating surrounds said auxiliary mirror reflector, and wherein said curved recess is established at said region of said second surface of said front glass substrate by at least one of grinding and ablating before said transparent conductor coating is disposed at said generally planar surface of said second surface of said front glass substrate;
wherein said electrochromic medium disposed between said second surface of said front glass substrate and said third surface of said rear glass substrate is in contact with said principal planar reflector portion and with said auxiliary wide angle curved portion;
wherein said principal planar reflector portion comprises a principal mirror reflector established at said third surface of said rear glass substrate; and
wherein said metallic reflector coating is coated at said curved recess and at a generally planar surface region of said second surface of said front glass substrate immediately adjacent said curved recess, and wherein the portion of said metallic reflector coating coated at said curved recess is contiguous with the portion of said metallic reflector coating coated at said generally planar surface region of said second surface of said front glass substrate immediately adjacent said curved recess.

122. An electrochromic mirror reflective element suitable for use in an exterior rearview mirror assembly of a vehicle, said electrochromic mirror reflective element comprising:
a front glass substrate having a first surface and a second surface;
a rear glass substrate having a third surface and a fourth surface;
an electrochromic medium disposed between said second surface of said front glass substrate and said third surface of said rear glass substrate;
said electrochromic medium bounded by a seal, said seal joining said front glass substrate to said rear glass substrate;
a principal planar reflector portion and an auxiliary wide angle curved portion;
wherein said principal planar reflector portion comprises a principal mirror reflector established at said third surface of said rear glass substrate;
wherein said auxiliary wide angle curved portion comprises a curved recess established by at least one of grinding and ablating;
wherein said auxiliary wide angle curved portion comprises an auxiliary mirror reflector established at said curved recess;
wherein said first surface of said front glass substrate comprises a generally planar surface;
wherein said third surface of said rear glass substrate comprises a generally planar surface;
wherein said curved recess has a cross-dimension size that is less than or equal to about 80 millimeters;
wherein said curved recess comprises a radius of curvature that is in the range from about 200 millimeters to about 1,000 millimeters;
wherein said curved recess has a maximum recess depth that is in the range from about 0.11 millimeters to about 2.26 millimeters;
wherein said auxiliary wide angle curved portion is inboard of a perimeter edge of said electrochromic mirror reflective element and wherein said principal planar reflector portion of said electrochromic mirror reflective element surrounds said auxiliary wide angle curved portion of said electrochromic mirror reflective element as viewed through said front glass substrate;
wherein said auxiliary mirror reflector comprises a metallic reflector coating;
wherein a transparent conductor coating is disposed at said second surface of said front glass substrate;
wherein at least one of (i) said curved recess is generally circular-shaped, (ii) said curved recess comprises a spherical convex-curved surface, (iii) said curved recess is generally circular-shaped and said curved recess comprises a spherical convex-curved surface, (iv) said curved recess comprises an aspherical convex-curved surface, (v) said curved recess comprises a compound curved convex-curved surface and (vi) said curved recess is canted relative to said principal planar reflector portion of said electrochromic mirror reflective element;
wherein said electrochromic medium disposed between said second surface of said front glass substrate and said third surface of said rear glass substrate is in contact with said principal planar reflector portion and with said auxiliary wide angle curved portion;
wherein said transparent conductor coating abuts said auxiliary mirror reflector and wherein said transparent conductor coating surrounds said auxiliary mirror reflector, and wherein said curved recess is established at a region of said second surface of said front glass substrate by at least one of grinding and ablating before said transparent conductor coating is disposed at said second surface of said front glass substrate;
wherein said metallic reflector coating is coated at said curved recess and at a planar substrate surface immediately adjacent said curved recess and wherein the portion of said metallic reflector coating coated at said curved recess is contiguous with the portion of said metallic reflector coating coated at said planar substrate surface immediately adjacent said curved recess; and wherein said front glass substrate has a thickness between said first surface and said second surface of less than 3 millimeters.

123. An electrochromic mirror reflective element suitable for use in an exterior rearview mirror assembly of a vehicle, said electrochromic mirror reflective element comprising:

a front glass substrate having a first surface and a second surface;

a rear glass substrate having a third surface and a fourth surface;

an electrochromic medium disposed between said second surface of said front glass substrate and said third surface of said rear glass substrate;

said electrochromic medium bounded by a seal, said seal joining said front glass substrate to said rear glass substrate;

a principal planar reflector portion and an auxiliary wide angle curved portion;

wherein said principal planar reflector portion comprises a principal mirror reflector established at a surface of said rear glass substrate;

wherein said auxiliary wide angle curved portion comprises a curved recess established at a region of a surface of one of said front glass substrate and said rear glass substrate by at least one of grinding and ablating;

wherein said auxiliary wide angle curved portion comprises an auxiliary mirror reflector established at said curved recess;

wherein said first surface of said front glass substrate comprises a generally planar surface;

wherein said third surface of said rear glass substrate comprises a generally planar surface;

wherein said curved recess has a cross-dimension size that is less than or equal to about 80 millimeters;

wherein said curved recess comprises a radius of curvature that is in the range from about 200 millimeters to about 1,000 millimeters;

wherein said curved recess has a maximum recess depth that is in the range from about 0.11 millimeters to about 4.04 millimeters;

wherein said auxiliary wide angle curved portion is inboard of a perimeter edge of said electrochromic mirror reflective element;

wherein said auxiliary mirror reflector comprises a metallic reflector coating;

wherein, when a voltage is applied to said electrochromic medium, said electrochromic medium dims to reduce reflectivity of visible light at said principal planar reflector portion;

wherein a transparent conductor coating is disposed at said generally planar surface of said second surface of said front glass substrate; and wherein said metallic reflector coating is coated at said curved recess and at a generally planar surface region immediately adjacent said curved recess and wherein the portion of said metallic reflector coating coated at said curved recess is contiguous with the portion of said metallic reflector coating coated at said generally planar surface region immediately adjacent said curved recess.

124. The electrochromic mirror reflective element of claim 123, wherein said curved recess is established at a region of said second surface of said front glass substrate by at least one of grinding and ablating, and wherein said transparent conductor coating abuts said auxiliary mirror reflector and wherein said transparent conductor coating surrounds said auxiliary mirror reflector, and wherein said front glass substrate has a thickness between said first surface and said second surface of less than 3 millimeters, and wherein said curved recess is generally circular-shaped, and wherein said generally planar surface region immediately adjacent said curved recess comprises a generally planar surface region of said second surface of said front glass substrate, and wherein said principal mirror reflector of said principal planar reflector portion comprises a metallic reflector that is established at said third surface of said rear glass substrate via sputter deposition.

125. The electrochromic mirror reflective element of claim 124, wherein, when a voltage is applied to said electrochromic medium of said electrochromic mirror reflective element, visible light reflectivity at said auxiliary wide angle curved portion is substantially unchanged.

126. The electrochromic mirror reflective element of claim 125, wherein said electrochromic medium disposed between said second surface of said front glass substrate and said third surface of said rear glass substrate is in contact with said principal planar reflector portion and with said auxiliary wide angle curved portion.

127. The electrochromic mirror reflective element of claim 125, wherein said electrochromic medium disposed between said second surface of said front glass substrate and said third surface of said rear glass substrate is in contact with said principal planar reflector portion and is not in contact with said auxiliary wide angle curved portion.

128. The electrochromic mirror reflective element of claim 127, wherein a seal joining said front substrate and said rear substrate prevents said electrochromic medium disposed between said second surface of said front glass substrate and said third surface of said rear glass substrate from contacting said auxiliary wide angle curved portion.

129. An electrochromic mirror reflective element suitable for use in an exterior rearview mirror assembly of a vehicle, said electrochromic mirror reflective element comprising:

a front glass substrate having a first surface and a second surface;

a rear glass substrate having a third surface and a fourth surface;

said electrochromic mirror reflective element comprising a principal planar reflector portion and an auxiliary wide angle curved portion;

wherein said principal planar reflector portion comprises a principal mirror reflector disposed at said rear glass substrate;

wherein said auxiliary wide angle curved portion comprises one of (a) a curved recess established at a region of said second surface of said front glass substrate by at least one of grinding and ablating and (b) a curved recess established at a region of said fourth surface of said rear glass substrate by at least one of grinding and ablating;

wherein said auxiliary wide angle curved portion comprises an auxiliary mirror reflector coated at said curved recess;

wherein said first surface of said front glass substrate comprises a generally planar surface;

wherein said third surface of said rear glass substrate comprises a generally planar surface;

wherein said curved recess has a cross-dimension size that is in the range from about 30 millimeters to about 80 millimeters;

wherein said curved recess comprises a radius of curvature that is in the range from about 200 millimeters to about 1,000 millimeters;

wherein said curved recess has a maximum recess depth that is in the range from about 0.11 millimeters to about 4.04 millimeters;

wherein said auxiliary mirror reflector comprises a metallic reflector coating; and wherein said metallic reflector coating is coated at said curved recess and at a generally planar surface region immediately adjacent said curved recess and wherein the portion of said metallic reflector coating coated at said curved recess is contiguous with the portion of said metallic reflector coating coated at said generally planar surface region immediately adjacent said curved recess.

130. The electrochromic mirror reflective element of claim 129, wherein said auxiliary wide angle curved portion comprises a curved recess established at a region of said second surface of said front glass substrate by at least one of grinding and ablating, and wherein a transparent conductor coating abuts said auxiliary mirror reflector and wherein said transparent conductor coating surrounds said auxiliary mirror reflector, and wherein said front glass substrate has a thickness between said first surface and said second surface of less than 3 millimeters, and wherein said curved recess is generally circular-shaped, and wherein said generally planar surface region immediately adjacent said curved recess comprises a generally planar surface region of said second surface of said front glass substrate, and wherein said principal mirror reflector of said principal planar reflector portion comprises a metallic reflector that is established at said third surface of said rear glass substrate via sputter deposition.

131. The electrochromic mirror reflective element of claim 130, wherein, when a voltage is applied to an electrochromic medium of said electrochromic mirror reflective element, visible light reflectivity at said auxiliary wide angle curved portion is substantially unchanged.

132. The electrochromic mirror reflective element of claim 131, wherein said electrochromic medium is disposed between said second surface of said front glass substrate and said third surface of said rear glass substrate and is in contact with said principal planar reflector portion and with said auxiliary wide angle curved portion.

133. The electrochromic mirror reflective element of claim 131, wherein said electrochromic medium is disposed between said second surface of said front glass substrate and said third surface of said rear glass substrate, and wherein said electrochromic medium is in contact with said principal planar reflector portion and is not in contact with said auxiliary wide angle curved portion.

134. The electrochromic mirror reflective element of claim 133, wherein a seal joining said front substrate and said rear substrate prevents said electrochromic medium disposed between said second surface of said front glass substrate and said third surface of said rear glass substrate from contacting said auxiliary wide angle curved portion.

135. An electrochromic mirror reflective element suitable for use in an exterior rearview mirror assembly of a vehicle, said electrochromic mirror reflective element comprising:

a front glass substrate having a first surface and a second surface;

a rear glass substrate having a third surface and a fourth surface;

an electrochromic medium disposed between said front and rear glass substrates, wherein said electrochromic medium is bounded by a seal and wherein said electrochromic medium comprises electrochromic material;

said electrochromic mirror reflective element comprising a principal planar reflector portion and an auxiliary wide angle curved portion;

wherein said principal planar reflector portion comprises a principal mirror reflector disposed at said rear glass substrate;

wherein said auxiliary wide angle curved portion comprises a curved recess established at a region of said second surface of said front glass substrate by at least one of grinding and ablating;

wherein said auxiliary wide angle curved portion comprises an auxiliary mirror reflector coated at said curved recess;

wherein said first surface of said front glass substrate comprises a generally planar surface;

wherein said third surface of said rear glass substrate comprises a generally planar surface;

wherein said curved recess has a cross-dimension size that is in the range from about 30 millimeters to about 80 millimeters;

wherein said curved recess comprises a radius of curvature that is in the range from about 200 millimeters to about 1,000 millimeters;

wherein said curved recess has a maximum recess depth that is in the range from about 0.11 millimeters to about 4.04 millimeters;

wherein said electrochromic medium disposed between said second surface of said front glass substrate and said third surface of said rear glass substrate is in contact with said principal planar reflector portion and with said auxiliary wide angle curved portion;

wherein said auxiliary wide angle curved portion is inboard of a perimeter edge of said electrochromic mirror reflective element;

wherein said curved recess is generally circular-shaped and comprises a spherical convex-curved surface;

wherein, when a voltage is applied to said electrochromic medium of said electrochromic mirror reflective element, (a) said electrochromic medium dims to reduce reflectivity of visible light at said principal planar reflector portion and (b) visible light reflectivity at said auxiliary wide angle curved portion is substantially unchanged;

wherein said principal mirror reflector of said principal planar reflector portion disposed at said rear glass substrate is disposed at said third surface of said rear glass substrate between said rear glass substrate and said electrochromic medium;

wherein said auxiliary mirror reflector comprises a metallic reflector coating, and wherein a transparent conductor coating is disposed at said generally planar surface of said second surface of said front glass substrate and wherein said transparent conductor coating is in contact with said auxiliary mirror reflector, and wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess; and wherein said front glass substrate has a thickness between said first surface and said second surface of less than 3 millimeters.

136. The electrochromic mirror reflective element of claim 135, wherein said curved recess has a maximum recess depth that is in the range from about 0.11 millimeters to about 1.57 millimeters and wherein said cross-dimension size of said curved recess is in the range from about 30 millimeters to about 50 millimeters.

137. The electrochromic mirror reflective element of claim 136, wherein, when an exterior rearview mirror assembly equipped with said electrochromic mirror reflective element is normally mounted at the side of a vehicle, said auxiliary wide angle curved portion is generally disposed at an outboard upper region of said electrochromic mirror reflective element relative to the side of the vehicle.

138. The electrochromic mirror reflective element of claim 137, wherein said curved recess is established at a region of said second surface of said front glass substrate by grinding before said transparent conductor coating is disposed at said generally planar surface of said second surface of said front glass substrate and before said auxiliary mirror reflector is established at said curved recess.

139. The electrochromic mirror reflective element of claim 138, wherein said transparent conductor coating comprises indium tin oxide.

140. The electrochromic mirror reflective element of claim 136, wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic mirror reflective element as normally mounted and used in an exterior rearview mirror assembly on a vehicle.

141. The electrochromic mirror reflective element of claim 140, wherein a further portion of said hiding layer traverses said front substrate at said auxiliary wide angle curved portion.

142. The electrochromic mirror reflective element of claim 141, wherein said portion of said hiding layer that traverses said front substrate at said auxiliary wide angle curved portion demarcates said auxiliary wide angle curved portion from said principal planar reflector portion.

143. The electrochromic mirror reflective element of claim 141, wherein a portion of said seal traverses between said front substrate and said rear substrate at said auxiliary wide angle curved portion, and wherein said portion of said hiding layer that traverses said front substrate at said auxiliary wide angle curved portion hides said portion of said seal that traverses between said front substrate and said rear substrate from direct view by a driver of a vehicle viewing said electrochromic mirror reflective element as normally mounted and used in an exterior rearview mirror assembly on a vehicle.

144. An electrochromic mirror reflective element suitable for use in an exterior rearview mirror assembly of a vehicle, said electrochromic mirror reflective element comprising:
 a front glass substrate having a first surface and a second surface;
 a rear glass substrate having a third surface and a fourth surface;
 an electrochromic medium disposed between said second surface of said front glass substrate and said third surface of said rear glass substrate;
 said electrochromic medium bounded by a seal, said seal joining said front glass substrate to said rear glass substrate;
 a principal planar reflector portion and an auxiliary wide angle curved portion;
 wherein said principal planar reflector portion comprises a principal mirror reflector established at said third surface of said rear glass substrate;
 wherein said auxiliary wide angle curved portion comprises a curved recess established at a region of said second surface of said front glass substrate by at least one of grinding and ablating;
 wherein said auxiliary wide angle curved portion comprises an auxiliary mirror reflector established at said curved recess;
 wherein said first surface of said front glass substrate comprises a generally planar surface;
 wherein, other than at said curved recess, said second surface of said front glass substrate comprises a generally planar surface;
 wherein said third surface of said rear glass substrate comprises a generally planar surface;
 wherein said fourth surface of said rear glass substrate comprises a generally planar surface;
 wherein said curved recess has a cross-dimension size that is less than or equal to about 80 millimeters;
 wherein said curved recess comprises a radius of curvature that is in the range from about 200 millimeters to about 1,000 millimeters;
 wherein said curved recess has a maximum recess depth that is in the range from about 0.11 millimeters to about 4.04 millimeters;
 wherein said auxiliary wide angle curved portion is inboard of a perimeter edge of said electrochromic mirror reflective element;
 wherein said curved recess is generally circular-shaped;
 wherein said auxiliary mirror reflector comprises a metallic reflector coating;
 wherein said electrochromic medium disposed between said second surface of said front glass substrate and said third surface of said rear glass substrate is in contact with said principal planar reflector portion and with said auxiliary wide angle curved portion; and
 wherein, when a voltage is applied to said electrochromic medium, said electrochromic medium dims to reduce reflectivity of visible light at said principal planar reflector portion and visible light reflectivity at said auxiliary wide angle curved portion is substantially unchanged.

145. The electrochromic mirror reflective element of claim 144, wherein said curved recess comprises a spherical convex-curved surface.

146. The electrochromic mirror reflective element of claim 145, wherein said front glass substrate has a thickness between said first surface and said second surface that allows said curved recess to have a depth in the range from about 0.5 millimeters deep and to about 3.09 millimeters deep.

147. The electrochromic mirror reflective element of claim 146, wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess.

148. The electrochromic mirror reflective element of claim 144, wherein said curved recess has a maximum recess depth that is in the range from about 0.11 millimeters to about 2.26 millimeters, and wherein said cross-dimension size of said curved recess is in the range from about 30 millimeters to about 60 millimeters.

149. The electrochromic mirror reflective element of claim 148, wherein said front glass substrate has a thickness between said first surface and said second surface of less than 3 millimeters.

150. The electrochromic mirror reflective element of claim 144, wherein said principal mirror reflector of said principal planar reflector portion comprises a metallic reflector that is established at said third surface of said rear glass substrate via sputter deposition, and wherein said electrochromic medium is sandwiched between said first and rear glass substrates at said auxiliary wide angle curved portion.

151. The electrochromic mirror reflective element of claim 144, wherein a transparent conductor coating is disposed at said generally planar surface of said second surface of said front glass substrate and wherein said transparent conductor coating is in contact with said auxiliary mirror reflector.

152. The electrochromic mirror reflective element of claim 151, wherein said auxiliary wide angle curved portion is inboard of a perimeter edge of said electrochromic mirror reflective element.

153. The electrochromic mirror reflective element of claim 144, wherein said curved recess is established at a region of said second surface of said front glass substrate by at least one of grinding and ablation before a transparent conductor coating is disposed at said generally planar surface of said second surface of said front glass substrate.

154. The electrochromic mirror reflective element of claim 149, wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic mirror reflective element as normally mounted and used in an exterior rearview mirror assembly on a vehicle.

155. The electrochromic mirror reflective element of claim 154, wherein a further portion of said hiding layer traverses said front substrate at said auxiliary wide angle curved portion.

156. The electrochromic mirror reflective element of claim 155, wherein said portion of said hiding layer that traverses said front substrate at said auxiliary wide angle curved portion demarcates said auxiliary wide angle curved portion from said principal planar reflector portion.

157. An electrochromic mirror reflective element suitable for use in an exterior rearview mirror assembly of a vehicle, said electrochromic mirror reflective element comprising:
a front glass substrate having a first surface and a second surface;
a rear glass substrate having a third surface and a fourth surface;
an electrochromic medium disposed between said second surface of said front glass substrate and said third surface of said rear glass substrate;
said electrochromic medium bounded by a seal, said seal joining said front glass substrate to said rear glass substrate;
a principal planar reflector portion and an auxiliary wide angle curved portion;
wherein said principal planar reflector portion comprises a principal mirror reflector established at said third surface of said rear glass substrate;
wherein said auxiliary wide angle curved portion comprises a curved recess established at a region of said second surface of said front glass substrate by at least one of grinding and ablating;
wherein said auxiliary wide angle curved portion comprises an auxiliary mirror reflector established at said curved recess;
wherein said first surface of said front glass substrate comprises a generally planar surface;
wherein, other than at said curved recess, said second surface of said front glass substrate comprises a generally planar surface;
wherein said third surface of said rear glass substrate comprises a generally planar surface;
wherein said fourth surface of said rear glass substrate comprises a generally planar surface;
wherein said curved recess has a cross-dimension size that is less than or equal to about 80 millimeters;
wherein said curved recess comprises a radius of curvature that is in the range from about 200 millimeters to about 1,000 millimeters;
wherein said curved recess has a maximum recess depth that is in the range from about 0.11 millimeters to about 4.04 millimeters;
wherein said auxiliary wide angle curved portion is inboard of a perimeter edge of said electrochromic mirror reflective element;
wherein said auxiliary mirror reflector comprises a metallic reflector coating;
wherein, when a voltage is applied to said electrochromic medium, said electrochromic medium dims to reduce reflectivity of visible light at said principal planar reflector portion and visible light reflectivity at said auxiliary wide angle curved portion is substantially unchanged; and
wherein a transparent conductor coating is disposed at said generally planar surface of said second surface of said front glass substrate.

158. The electrochromic mirror reflective element of claim 157, wherein said front glass substrate has a thickness between said first surface and said second surface of less than 3 millimeters.

159. The electrochromic mirror reflective element of claim 158, wherein at least one of (i) said curved recess is generally circular-shaped, (ii) said curved recess comprises a spherical convex-curved surface, (iii) said curved recess is generally circular-shaped and said curved recess comprises a spherical convex-curved surface, (iv) said curved recess comprises an aspherical convex-curved surface, (v) said curved recess comprises a compound curved convex-curved surface and (vi) said curved recess is canted relative to said principal planar reflector portion of said electrochromic mirror reflective element.

160. The electrochromic mirror reflective element of claim 159, wherein said front glass substrate has a thickness between said first surface and said second surface that allows said curved recess to have depth in the range from about 0.5 millimeters deep and to about 2.26 millimeters deep.

161. The electrochromic mirror reflective element of claim 160, wherein said cross-dimension size of said curved recess is in the range from about 30 millimeters to about 60 millimeters.

162. The electrochromic mirror reflective element of claim 161, wherein said electrochromic medium is sandwiched between said first and rear glass substrates at said auxiliary wide angle curved portion.

163. The electrochromic mirror reflective element of claim 162, wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess.

164. The electrochromic mirror reflective element of claim 163, wherein said curved recess is established at a region of said second surface of said front glass substrate by grinding before said transparent conductor coating is disposed at said generally planar surface of said second surface of said front glass substrate, and wherein said transparent conductor coating is in contact with said auxiliary mirror reflector.

165. The electrochromic mirror reflective element of claim 161, wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic mirror reflective element as normally mounted and used in an exterior rearview mirror assembly on a vehicle.

166. The electrochromic mirror reflective element of claim 165, wherein a further portion of said hiding layer traverses said front substrate at said auxiliary wide angle curved portion.

167. The electrochromic mirror reflective element of claim 166, wherein said portion of said hiding layer that traverses said front substrate at said auxiliary wide angle curved portion demarcates said auxiliary wide angle curved portion from said principal planar reflector portion.

168. The electrochromic mirror reflective element of claim 157, wherein said electrochromic medium disposed between said second surface of said front glass substrate and said third surface of said rear glass substrate is in contact with said principal planar reflector portion and with said auxiliary wide angle curved portion.

169. An electrochromic mirror reflective element suitable for use in an exterior rearview mirror assembly of a vehicle, said electrochromic mirror reflective element comprising:
a front glass substrate having a first surface and a second surface;
a rear glass substrate having a third surface and a fourth surface;
an electrochromic medium disposed between said second surface of said front glass substrate and said third surface of said rear glass substrate;
said electrochromic medium bounded by a seal, said seal joining said front glass substrate to said rear glass substrate;
a principal planar reflector portion and an auxiliary wide angle curved portion;
wherein said principal planar reflector portion comprises a principal mirror reflector established at a surface of said rear glass substrate;
wherein said auxiliary wide angle curved portion comprises a curved recess established at a region of said second surface of said front glass substrate by at least one of grinding and ablating;
wherein said auxiliary wide angle curved portion comprises an auxiliary mirror reflector established at said curved recess;
wherein said first surface of said front glass substrate comprises a generally planar surface;
wherein, other than at said curved recess, said second surface of said front glass substrate comprises a generally planar surface;
wherein said third surface of said rear glass substrate comprises a generally planar surface;
wherein said fourth surface of said rear glass substrate comprises a generally planar surface;
wherein said auxiliary wide angle curved portion is inboard of a perimeter edge of said electrochromic mirror reflective element;
wherein said auxiliary mirror reflector comprises a metallic reflector coating;
wherein a transparent conductor coating is disposed at said generally planar surface of said second surface of said front glass substrate and wherein said transparent conductor coating is in contact with said auxiliary mirror reflector;
wherein at least one of (i) said curved recess is generally circular-shaped, (ii) said curved recess comprises a spherical convex-curved surface, (iii) said curved recess is generally circular-shaped and said curved recess comprises a spherical convex-curved surface, (iv) said curved recess comprises an aspherical convex-curved surface, (v) said curved recess comprises a compound curved convex-curved surface and (vi) said curved recess is canted relative to said principal planar reflector portion of said electrochromic mirror reflective element;
wherein said front glass substrate has a thickness between said first surface and said second surface that allows said curved recess to have a depth in the range from about 0.5 millimeters deep and to about 3.09 millimeters deep;
wherein said curved recess comprises a radius of curvature that is in the range from about 200 millimeters to about 1,000 millimeters; and
wherein said curved recess has a maximum recess depth that is in the range from about 0.5 millimeters to about 3.09 millimeters.

170. The electrochromic mirror reflective element of claim 169, wherein said front glass substrate has a thickness between said first surface and said second surface of less than 3 millimeters.

171. The electrochromic mirror reflective element of claim 170, wherein said curved recess has a cross-dimension size that is in the range from about 30 millimeters to about 80 millimeters and wherein said curved recess is generally circular-shaped and wherein said curved recess comprises a spherical convex-curved surface.

172. The electrochromic mirror reflective element of claim 171, wherein said curved recess is established at a region of said second surface of said front glass substrate by at least one of grinding and ablating before said transparent conductor coating is disposed at said generally planar surface of said second surface of said front glass substrate.

173. The electrochromic mirror reflective element of claim 170, wherein said metallic reflector coating is coated at said curved recess and at a generally planar surface region of said second surface of said front glass substrate immediately adjacent said curved recess, and wherein the portion of said metallic reflector coating coated at said curved recess is contiguous with the portion of said metallic reflector coating coated at said generally planar surface region of said second surface of said front glass substrate immediately adjacent said curved recess.

174. The electrochromic mirror reflective element of claim 173, wherein, when a voltage is applied to said electrochromic medium, said electrochromic medium dims to reduce reflectivity of visible light at said principal planar reflector portion and visible light reflectivity at said auxiliary wide angle curved portion is substantially unchanged.

175. The electrochromic mirror reflective element of claim 171, wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic mirror reflective element as normally mounted and used in an exterior rearview mirror assembly on a vehicle.

176. The electrochromic mirror reflective element of claim 175, wherein a further portion of said hiding layer traverses said front substrate at said auxiliary wide angle curved portion.

177. The electrochromic mirror reflective element of claim 176, wherein said portion of said hiding layer that traverses said front substrate at said auxiliary wide angle curved portion demarcates said auxiliary wide angle curved portion from said principal planar reflector portion.

178. The electrochromic mirror reflective element of claim 171, wherein said electrochromic medium disposed between said second surface of said front glass substrate and said third surface of said rear glass substrate is in contact with said principal planar reflector portion and with said auxiliary wide angle curved portion.

179. An electrochromic mirror reflective element suitable for use in an exterior rearview mirror assembly of a vehicle, said electrochromic minor reflective element comprising:
 a front glass substrate having a first surface and a second surface;
 a rear glass substrate having a third surface and a fourth surface;
 an electrochromic medium disposed between said second surface of said front glass substrate and said third surface of said rear glass substrate;
 said electrochromic medium bounded by a seal, said seal joining said front glass substrate to said rear glass substrate;
 a principal planar reflector portion and an auxiliary wide angle curved portion;
 wherein said principal planar reflector portion comprises a principal mirror reflector established at a surface of said rear glass substrate;
 wherein said auxiliary wide angle curved portion comprises a curved recess established at a region of said second surface of said front glass substrate by at least one of grinding and ablating;
 wherein said auxiliary wide angle curved portion comprises an auxiliary mirror reflector established at said curved recess;
 wherein said first surface of said front glass substrate comprises a generally planar surface;
 wherein, other than at said curved recess, said second surface of said front glass substrate comprises a generally planar surface;
 wherein said third surface of said rear glass substrate comprises a generally planar surface;
 wherein said fourth surface of said rear glass substrate comprises a generally planar surface;
 wherein said curved recess has a cross-dimension size that is less than or equal to about 80 millimeters;
 wherein said curved recess comprises a radius of curvature that is in the range from about 200 millimeters to about 800 millimeters;
 wherein said curved recess has a maximum recess depth that is in the range from about 0.11 millimeters to about 3.09 millimeters;
 wherein said electrochromic medium disposed between said second surface of said front glass substrate and third surface of said rear glass substrate is in contact with said principal planar reflector portion and with said auxiliary wide angle curved portion;
 wherein said auxiliary wide angle curved portion is inboard of a perimeter edge of said electrochromic mirror reflective element;
 wherein said auxiliary mirror reflector comprises a metallic reflector coating; and
 wherein a transparent conductor coating is disposed at said generally planar surface of said second surface of said front glass substrate.

180. The electrochromic mirror reflective element of claim 179, wherein said curved recess comprises a spherical convex-curved surface, and wherein said curved recess has a depth in the range from about 0.5 millimeters deep and to about 2.26 millimeters deep.

181. The electrochromic mirror reflective element of claim 179, wherein said curved recess has a maximum recess depth that is in the range from about 0.11 millimeters to about 2.26 millimeters, and wherein said cross-dimension size of said curved recess is in the range from about 30 millimeters to about 60 millimeters, and wherein said metallic reflector coating of said principal minor reflector of said principal planar reflector portion is established via sputter deposition and wherein said front glass substrate has a thickness between said first surface and said second surface of less than 3 millimeters.

182. The electrochromic mirror reflective element of claim 179, and wherein said transparent conductor coating is in contact with said auxiliary mirror reflector, and wherein said curved recess is established at a region of said second surface of said front glass substrate by at least one of grinding and ablation before said transparent conductor coating is disposed at said generally planar surface of said second surface of said front glass substrate.

183. The electrochromic mirror reflective element of claim 179, wherein said principal planar reflector portion comprises a principal mirror reflector established at said third surface of said rear glass substrate, and wherein said metallic reflector coating is coated at said curved recess and at a generally planar surface region of said second surface of said front glass substrate immediately adjacent said curved recess and wherein the portion of said metallic reflector coating coated at said curved recess is contiguous with the portion of said metallic reflector coating coated at said generally planar surface region of said second surface of said front glass substrate immediately adjacent said curved recess, and wherein said curved recess is generally circular-shaped.

184. The electrochromic mirror reflective element of claim 179, wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic mirror reflective element as normally mounted and used in an exterior rearview mirror assembly on a vehicle.

185. The electrochromic mirror reflective element of claim 184, wherein a further portion of said hiding layer traverses said front substrate at said auxiliary wide angle curved portion.

186. The electrochromic mirror reflective element of claim 185, wherein said portion of said hiding layer that traverses said front substrate at said auxiliary wide angle curved portion demarcates said auxiliary wide angle curved portion from said principal planar reflector portion.

187. An electrochromic mirror reflective element suitable for use in an exterior rearview mirror assembly of a vehicle, said electrochromic mirror reflective element comprising:
- a front glass substrate having a first surface and a second surface;
- a rear glass substrate having a third surface and a fourth surface;
- an electrochromic medium disposed between said second surface of said front glass substrate and said third surface of said rear glass substrate;
- said electrochromic medium bounded by a seal, said seal joining said front glass substrate to said rear glass substrate;
- a principal planar reflector portion and an auxiliary wide angle curved portion;
- wherein said principal planar reflector portion comprises a principal mirror reflector established at a surface of said rear glass substrate;
- wherein said auxiliary wide angle curved portion comprises a curved recess established at a region of said second surface of said front glass substrate by at least one of grinding and ablating;
- wherein said auxiliary wide angle curved portion comprises an auxiliary mirror reflector established at said curved recess;
- wherein said first surface of said front glass substrate comprises a generally planar surface;
- wherein, other than at said curved recess, said second surface of said front glass substrate comprises a generally planar surface;
- wherein said third surface of said rear glass substrate comprises a generally planar surface;
- wherein said fourth surface of said rear glass substrate comprises a generally planar surface;
- wherein said curved recess has a cross-dimension size has a cross-dimension size that is less than or equal to about 80 millimeters;
- wherein said curved recess comprises a radius of curvature that is in the range from about 200 millimeters to about 1,000 millimeters;
- wherein said front glass substrate has a thickness between said first surface and said second surface of less than 3 millimeters;
- wherein said auxiliary wide angle curved portion is inboard of a perimeter edge of said electrochromic mirror reflective element;
- wherein said auxiliary minor reflector comprises a metallic reflector coating;
- wherein a transparent conductor coating is disposed at said generally planar surface of said second surface of said front glass substrate;
- wherein said curved recess has a depth of at least about 0.5 millimeters deep;
- wherein said transparent conductor coating is in contact with said auxiliary mirror reflector, and wherein said curved recess is established at a region of said second surface of said front glass substrate by at least one of grinding and ablation before said transparent conductor coating is disposed at said generally planar surface of said second surface of said front glass substrate;
- wherein said electrochromic medium disposed between said second surface of said front glass substrate and said third surface of said rear glass substrate is in contact with said principal planar reflector portion and with said auxiliary wide angle curved portion;
- wherein said principal planar reflector portion comprises a principal mirror reflector established at said third surface of said rear glass substrate; and
- wherein said metallic reflector coating is coated at said curved recess and at a generally planar surface region of said second surface of said front glass substrate immediately adjacent said curved recess, and wherein the portion of said metallic reflector coating coated at said curved recess is contiguous with the portion of said metallic reflector coating coated at said generally planar surface region of said second surface of said front glass substrate immediately adjacent said curved recess.

188. The electrochromic mirror reflective element of claim 187, wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic minor reflective element as normally mounted and used in an exterior rearview mirror assembly on a vehicle.

189. The electrochromic mirror reflective element of claim 188, wherein a further portion of said hiding layer traverses said front substrate at said auxiliary wide angle curved portion.

190. The electrochromic mirror reflective element of claim 189, wherein said portion of said hiding layer that traverses said front substrate at said auxiliary wide angle curved portion demarcates said auxiliary wide angle curved portion from said principal planar reflector portion.

191. An electrochromic mirror reflective element suitable for use in an exterior rearview mirror assembly of a vehicle, said electrochromic minor reflective element comprising:
- a front glass substrate having a first surface and a second surface;
- a rear glass substrate having a third surface and a fourth surface;
- an electrochromic medium disposed between said second surface of said front glass substrate and said third surface of said rear glass substrate;
- said electrochromic medium bounded by a seal, said seal joining said front glass substrate to said rear glass substrate;
- a principal planar reflector portion and an auxiliary wide angle curved portion;
- wherein said principal planar reflector portion comprises a principal mirror reflector established at said third surface of said rear glass substrate;
- wherein said auxiliary wide angle curved portion comprises a curved recess established by at least one of grinding and ablating;
- wherein said auxiliary wide angle curved portion comprises an auxiliary mirror reflector established at said curved recess;
- wherein said first surface of said front glass substrate comprises a generally planar surface;
- wherein said third surface of said rear glass substrate comprises a generally planar surface;

wherein said curved recess has a cross-dimension size that is less than or equal to about 80 millimeters;

wherein said curved recess comprises a radius of curvature that is in the range from about 200 millimeters to about 1,000 millimeters;

wherein said curved recess has a maximum recess depth that is in the range from about 0.11 millimeters to about 2.26 millimeters;

wherein said auxiliary wide angle curved portion is inboard of a perimeter edge of said electrochromic mirror reflective element;

wherein a transparent conductor coating is disposed at said second surface of said front glass substrate;

wherein at least one of (i) said curved recess is generally circular-shaped, (ii) said curved recess comprises a spherical convex-curved surface, (iii) said curved recess is generally circular-shaped and said curved recess comprises a spherical convex-curved surface, (iv) said curved recess comprises an aspherical convex-curved surface, (v) said curved recess comprises a compound curved convex-curved surface and (vi) said curved recess is canted relative to said principal planar reflector portion of said electrochromic mirror reflective element;

wherein said electrochromic medium disposed between said second surface of said front glass substrate and said third surface of said rear glass substrate is in contact with said principal planar reflector portion and with said auxiliary wide angle curved portion;

wherein said transparent conductor coating is in contact with said auxiliary mirror reflector, and wherein said curved recess is established at a region of said second surface of said front glass substrate by at least one of grinding and ablation before said transparent conductor coating is disposed at said second surface of said front glass substrate;

wherein said metallic reflector coating is coated at said curved recess and at a planar substrate surface immediately adjacent said curved recess and wherein the portion of said metallic reflector coating coated at said curved recess is contiguous with the portion of said metallic reflector coating coated at said planar substrate surface immediately adjacent said curved recess; and wherein said front glass substrate has a thickness between said first surface and said second surface of less than 3 millimeters.

192. The electrochromic mirror reflective element of claim 191, wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic mirror reflective element as normally mounted and used in an exterior rearview mirror assembly on a vehicle.

193. The electrochromic mirror reflective element of claim 192, wherein a further portion of said hiding layer traverses said front substrate at said auxiliary wide angle curved portion.

194. The electrochromic mirror reflective element of claim 193, wherein said portion of said hiding layer that traverses said front substrate at said auxiliary wide angle curved portion demarcates said auxiliary wide angle curved portion from said principal planar reflector portion.

195. An electrochromic mirror reflective element suitable for use in an exterior rearview mirror assembly of a vehicle, said electrochromic mirror reflective element comprising:

a front glass substrate having a first surface and a second surface;

a rear glass substrate having a third surface and a fourth surface;

said electrochromic mirror reflective element comprising a principal planar reflector portion and an auxiliary wide angle curved portion;

wherein said principal planar reflector portion comprises a principal mirror reflector disposed at said rear glass substrate;

wherein said auxiliary wide angle curved portion comprises one of (a) a curved recess established at a region of said second surface of said front glass substrate by at least one of grinding and ablating and (b) a curved recess established at a region of said fourth surface of said rear glass substrate by at least one of grinding and ablating;

wherein said auxiliary wide angle curved portion comprises an auxiliary mirror reflector coated at said curved recess;

wherein said first surface of said front glass substrate comprises a generally planar surface;

wherein said third surface of said rear glass substrate comprises a generally planar surface;

wherein said curved recess has a cross-dimension size that is in the range from about 30 millimeters to about 80 millimeters;

wherein said curved recess comprises a radius of curvature that is in the range from about 200 millimeters to about 1,000 millimeters;

wherein said curved recess has a maximum recess depth that is in the range from about 0.11 millimeters to about 4.04 millimeters;

wherein said auxiliary mirror reflector comprises a metallic reflector coating; and wherein said metallic reflector coating is coated at said curved recess and at a generally planar surface region immediately adjacent said curved recess and wherein the portion of said metallic reflector coating coated at said curved recess is contiguous with the portion of said metallic reflector coating coated at said generally planar surface region immediately adjacent said curved recess.

196. The electrochromic mirror reflective element of claim 195, wherein said auxiliary wide angle curved portion comprises a curved recess established at a region of said second surface of said front glass substrate by at least one of grinding and ablating, and wherein a transparent conductor coating is in contact with said auxiliary mirror reflector, and wherein said front glass substrate has a thickness between said first surface and said second surface of less than 3 millimeters, and wherein said curved recess is generally circular-shaped, and wherein said generally planar surface region immediately adjacent said curved recess comprises a generally planar surface region of said second surface of said front glass substrate, and wherein said principal mirror reflector of said principal planar reflector portion comprises a metallic reflector that is established at said third surface of said rear glass substrate via sputter deposition, and wherein, when a voltage is applied to an electrochromic medium of said electrochromic mirror reflective element, visible light reflectivity at said auxiliary wide angle curved portion is substantially unchanged, and wherein said electrochromic medium is disposed between said second surface of said front glass substrate and said third surface of said rear glass substrate and is in contact with said principal planar reflector portion and with said auxiliary wide angle curved portion.

197. The electrochromic mirror reflective element of claim 196, wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic mirror reflective element as normally mounted and used in an exterior rearview mirror assembly on a vehicle.

198. The electrochromic mirror reflective element of claim 197, wherein a further portion of said hiding layer traverses said front substrate at said auxiliary wide angle curved portion.

199. The electrochromic mirror reflective element of claim 198, wherein said portion of said hiding layer that traverses said front substrate at said auxiliary wide angle curved portion demarcates said auxiliary wide angle curved portion from said principal planar reflector portion.

200. An electrochromic mirror reflective element suitable for use in an exterior rearview mirror assembly of a vehicle, said electrochromic mirror reflective element comprising:
a front glass substrate having a first surface and a second surface;
a rear glass substrate having a third surface and a fourth surface;
said electrochromic mirror reflective element comprising a principal planar reflector portion and an auxiliary wide angle curved portion;
wherein said principal planar reflector portion comprises a principal mirror reflector disposed at said rear glass substrate;
wherein said auxiliary wide angle curved portion comprises a curved recess established at a region of said second surface of said front glass substrate by at least one of grinding and ablating;
wherein said auxiliary wide angle curved portion comprises an auxiliary mirror reflector coated at said curved recess;
wherein said first surface of said front glass substrate comprises a generally planar surface;
wherein said third surface of said rear glass substrate comprises a generally planar surface;
wherein said curved recess has a cross-dimension size that is in the range from about 30 millimeters to about 60 millimeters;
wherein said curved recess comprises a radius of curvature that is in the range from about 200 millimeters to about 800 millimeters;
wherein said curved recess has a maximum recess depth that is in the range from about 0.11 millimeters to about 2.26 millimeters;
wherein said auxiliary mirror reflector comprises a metallic reflector coating;
wherein said front glass substrate has a thickness between said first surface and said second surface of less than 3 millimeters, and wherein said curved recess is generally circular-shaped, and wherein said principal mirror reflector of said principal planar reflector portion comprises a metallic reflector that is established at said third surface of said rear glass substrate via sputter deposition, and wherein, when a voltage is applied to an electrochromic medium of said electrochromic mirror reflective element, visible light reflectivity at said auxiliary wide angle curved portion is substantially unchanged, and wherein said electrochromic medium is disposed between said second surface of said front glass substrate and said third surface of said rear glass substrate and is in contact with said principal planar reflector portion and with said auxiliary wide angle curved portion;
wherein said seal is disposed between said second surface of said front glass substrate and said third surface of said rear glass substrate around a perimeter border region thereof, and wherein a hiding layer is disposed between said second surface of said front glass substrate and said seal, said hiding layer comprising a perimeter metallic band that hides said seal from direct view by a driver of a vehicle viewing said electrochromic mirror reflective element as normally mounted and used in an exterior rearview mirror assembly on a vehicle;
wherein a further portion of said hiding layer traverses said front substrate at said auxiliary wide angle curved portion; and
wherein said portion of said hiding layer that traverses said front substrate at said auxiliary wide angle curved portion demarcates said auxiliary wide angle curved portion from said principal planar reflector portion.

201. The electrochromic mirror reflective element of claim 200, wherein said metallic reflector coating is coated at said curved recess and at a generally planar surface region of said second surface of said front substrate immediately adjacent said curved recess and wherein the portion of said metallic reflector coating coated at said curved recess is contiguous with the portion of said metallic reflector coating coated at said generally planar surface region immediately adjacent said curved recess, and wherein a transparent conductor coating is disposed at said second surface of said front substrate and is in contact with said auxiliary mirror reflector.

* * * * *

UNITED STATES PATENT AND TRADEMARK OFFICE
CERTIFICATE OF CORRECTION

PATENT NO. : 8,021,005 B2
APPLICATION NO. : 13/097570
DATED : September 20, 2011
INVENTOR(S) : Mingtang Zhao It is certified that error appears in the above-identified patent and that said Letters Patent is hereby corrected as shown below:

Column 4
Line 21, "favored" should be --formed--

Column 12
Line 13, "Set." should be --Ser.--

Column 13
Line 35, "applications;" should be --applications,--

Column 15
Line 12, "Set" should be --Ser.--

Column 19
Line 60, Claim 25, "minor" should be --mirror--

Column 20
Line 54, Claim 35, "minor" should be --mirror--

Column 24
Line 53, Claim 76, "minor" should be --mirror--
Line 65, Claim 78, "electrochromie" should be --electrochromic--

Column 39
Line 5, Claim 137, "minor" should be --mirror--

Column 45
Line 31, Claim 179, "minor" should be --mirror--

Signed and Sealed this
Twenty-seventh Day of March, 2012

David J. Kappos
*Director of the United States Patent and Trademark Office*

CERTIFICATE OF CORRECTION (continued)
U.S. Pat. No. 8,021,005 B2

Column 46
Line 28, Claim 181, "minor" should be --mirror--

Column 47
Line 56, Claim 187, "minor" should be --mirror--

Column 48
Line 28, Claim 188, "minor" should be --mirror--
Line 42, Claim 191, "minor" should be --mirror--